(12) United States Patent
Wang et al.

(10) Patent No.: US 9,131,616 B2
(45) Date of Patent: Sep. 8, 2015

(54) METALLIZED FILM-OVER-FOAM CONTACTS

(71) Applicant: Laird Technologies, Inc., Earth City, MO (US)

(72) Inventors: Weifan Wang, New Taipei (TW); Yi-Shen Lin, New Taipei (TW); Larry D. Creasy, Jr., St. Clair, MO (US)

(73) Assignee: Laird Technologies, Inc., Earth City, MO (US)

( * ) Notice: Subject to any disclaimer, the term of this patent is extended or adjusted under 35 U.S.C. 154(b) by 0 days.

(21) Appl. No.: 14/219,104

(22) Filed: Mar. 19, 2014

(65) Prior Publication Data

US 2014/0203069 A1    Jul. 24, 2014

Related U.S. Application Data

(63) Continuation-in-part of application No. PCT/US2013/051350, filed on Jul. 19, 2013.

(60) Provisional application No. 61/676,927, filed on Jul. 28, 2012.

(51) Int. Cl.

| | |
|---|---|
| *B23K 31/02* | (2006.01) |
| *H05K 1/11* | (2006.01) |
| *B23K 1/00* | (2006.01) |
| *H05K 9/00* | (2006.01) |
| *H05K 1/03* | (2006.01) |

(52) U.S. Cl.
CPC .............. *H05K 1/11* (2013.01); *B23K 1/0016* (2013.01); *H05K 1/0306* (2013.01); *H05K 9/0015* (2013.01); *Y10T 428/249982* (2015.04)

(58) Field of Classification Search
None
See application file for complete search history.

(56) References Cited

U.S. PATENT DOCUMENTS

| | | | |
|---|---|---|---|
| 4,048,137 A | 9/1977 | Heitmann | |
| 5,045,635 A | 9/1991 | Kaplo et al. | |
| 5,470,787 A * | 11/1995 | Greer | 438/614 |
| 5,569,877 A | 10/1996 | Yumi | |
| 5,656,795 A | 8/1997 | Miska | |
| 6,107,180 A * | 8/2000 | Munroe et al. | 438/613 |
| 6,210,789 B1 | 4/2001 | Hanrahan | |
| 6,235,986 B1 | 5/2001 | Reis et al. | |

(Continued)

FOREIGN PATENT DOCUMENTS

| | | |
|---|---|---|
| AU | 749275 | 2/1999 |
| CA | 2325141 | 2/1999 |

(Continued)

OTHER PUBLICATIONS

International Search Report and Written Opinion from PCT Application No. PCT/US2013/051350 dated Dec. 6, 2013, which the instant application claims priority to; 13 pgs.

*Primary Examiner* — Kiley Stoner
(74) *Attorney, Agent, or Firm* — Harness, Dickey & Pierce, P.L.C.

(57) ABSTRACT

A metallized film-over-foam contact suitable for circuit grounding of surface mount technology devices generally includes a silicone foam resilient core member, a solderable electrically conductive layer, and an adhesive bonding the solderable electrically conductive layer to the resilient core member. The adhesive has no more than a maximum of 900 parts per million chlorine, no more than a maximum of 900 parts per million bromine, and no more than a maximum of 1,500 parts per million total halogens.

20 Claims, 11 Drawing Sheets

(56) References Cited

U.S. PATENT DOCUMENTS

| | | |
|---|---|---|
| 6,255,581 B1 | 7/2001 | Reis et al. |
| 6,309,742 B1 | 10/2001 | Clupper et al. |
| 6,376,279 B1* | 4/2002 | Kwon et al. ............ 438/113 |
| 6,400,034 B1* | 6/2002 | Kimura et al. ............ 257/778 |
| 6,534,706 B1 | 3/2003 | Rapp et al. |
| 6,570,776 B2 | 5/2003 | MacDonald, Jr. et al. |
| 6,774,301 B1 | 8/2004 | Kordes et al. |
| 6,777,095 B2 | 8/2004 | Bunyan et al. |
| 6,943,288 B1 | 9/2005 | Miska |
| 7,060,348 B2 | 6/2006 | Creasy et al. |
| 7,078,092 B2 | 7/2006 | Leerkamp |
| 7,120,005 B1 | 10/2006 | Luch |
| 7,129,421 B2 | 10/2006 | Reis et al. |
| 7,375,291 B2 | 5/2008 | Ariel |
| 7,432,188 B2* | 10/2008 | Tsai et al. ............ 438/614 |
| 7,488,181 B2 | 2/2009 | van Haaster |
| 7,763,810 B2 | 7/2010 | van Haaster |
| 7,931,475 B2 | 4/2011 | Kim et al. |
| 2001/0006422 A1* | 7/2001 | Fukagawa et al. ............ 356/500 |
| 2002/0046849 A1 | 4/2002 | Rapp et al. |
| 2003/0025203 A1* | 2/2003 | Akram et al. ............ 257/737 |
| 2003/0155408 A1* | 8/2003 | Fanti et al. ............ 228/215 |
| 2004/0092092 A1* | 5/2004 | Yang ............ 438/612 |
| 2006/0180348 A1* | 8/2006 | Cloutier et al. ............ 174/350 |
| 2006/0222774 A1 | 10/2006 | Flanders |
| 2006/0272855 A1 | 12/2006 | Rutherford et al. |
| 2006/0276023 A1* | 12/2006 | Huang et al. ............ 438/612 |
| 2006/0278984 A1* | 12/2006 | Yamada ............ 257/737 |
| 2007/0011693 A1 | 1/2007 | Creasy, Jr. |
| 2009/0008431 A1 | 1/2009 | Zonvide et al. |
| 2010/0109159 A1* | 5/2010 | Ho et al. ............ 257/737 |
| 2010/0258344 A1 | 10/2010 | Creasy, Jr. |
| 2011/0101526 A1* | 5/2011 | Hsiao et al. ............ 257/738 |
| 2011/0101527 A1* | 5/2011 | Cheng et al. ............ 257/738 |
| 2011/0188226 A1 | 8/2011 | Kim |
| 2011/0309490 A1* | 12/2011 | Lu et al. ............ 257/737 |
| 2012/0091577 A1* | 4/2012 | Hwang et al. ............ 257/737 |
| 2013/0062755 A1* | 3/2013 | Kuo et al. ............ 257/737 |
| 2014/0021606 A1* | 1/2014 | Arvin et al. ............ 257/738 |
| 2014/0159236 A1* | 6/2014 | Kim et al. ............ 257/737 |
| 2014/0264843 A1* | 9/2014 | Lin et al. ............ 257/737 |
| 2014/0291838 A1* | 10/2014 | Chen et al. ............ 257/737 |

FOREIGN PATENT DOCUMENTS

| | | |
|---|---|---|
| CN | 1295782 A | 5/2001 |
| DE | 699 08 594 T2 | 4/2004 |
| DE | 698 34 000 T2 | 1/2007 |
| DK | 1090538 T3 | 9/2003 |
| EP | 0403112 | 12/1990 |
| EP | 1 090 538 B1 | 6/2003 |
| EP | 0 860 834 B1 | 3/2006 |
| EP | 1 568 261 B1 | 6/2013 |
| ES | 2195546 | 12/2003 |
| HU | 0102258 A2 | 9/2001 |
| JP | 10-237255 | 9/1998 |
| JP | 4249391 | 4/2009 |
| JP | 4607598 | 1/2011 |
| KR | 10-0680015 | 2/2007 |
| KR | 20090083095 | 8/2009 |
| WO | WO 99/51074 | 10/1999 |
| WO | WO 2004/054344 A1 | 6/2004 |
| WO | WO 2008/004741 A1 | 1/2008 |
| WO | WO 2014/022125 A1 | 2/2014 |
| WO | WO 2014022125 A1 * | 2/2014 |

* cited by examiner

| | TEMPERATURE PROFILE | CONDITION | |
|---|---|---|---|
| | | TEMPERATURE | TIME |
| A | PREHEATING STAGE | ROOM TEMPERATURE ~180°C | 30 sec. |
| B | HEATING STAGE | 180~200°C | 35~185 sec. |
| C | PEAK TEMPERATURE | 200~245°C | 185~225 sec. |
| D | COOLING STAGE | 245°C~ROOM TEMPERATURE | >60 sec. |

METALLIZED FILM-OVER-FOAM CONTACTS

CROSS-REFERENCE TO RELATED APPLICATION

This application is a continuation-in-part of International Application No. PCT/US2013/051350, filed Jul. 19, 2013, which claims the benefit of U.S. Provisional Application No. 61/676,927, filed Jul. 28, 2012. The entire disclosures of each of these applications are incorporated herein by reference.

FIELD

The present disclosure generally relates to contacts (e.g., metallized film-over-foam contacts, etc.) that can be surface mounted (e.g., soldered, etc.) to desired surfaces in association with surface mount technologies to establish electrical contact between the desired surfaces and the contacts, and that can be used for grounding purposes and/or shielding purposes, and that are also formed from environmentally friendly materials (e.g., halogen-free flame or fire retardants, etc.) and/or are capable of achieving desired flame ratings according to Underwriters Laboratories Standard No. 94 such as, for example, Horizontal Burn (HB), and Vertical Burn V-1, V-2, and preferably V-0, etc.

BACKGROUND

This section provides background information related to the present disclosure which is not necessarily prior art.

Printed circuit boards (PCBs) usually include electrical components that radiate electromagnetic waves, which may cause noise or unwanted signals to appear in electrical devices existing within a certain proximity of the radiating electrical components. Accordingly, it is not uncommon to provide grounding for circuitry that emits or is susceptible to electromagnetic radiation, to thereby allow offending electrical charges and fields to be dissipated without disrupting operation.

To accomplish this grounding, some printed circuit boards are provided with pem-type standoffs. Additional grounding solutions may include customized gaskets that are designed specifically for the particular application. In such applications, the custom design usually depends, for example, on the exact printed circuit board layout and configuration. Other grounding solutions require through holes on multi-layered boards, which may entail re-routing hundreds of ground traces. Plus, the need for additional grounding contacts frequently arises later during the PCB layout. Other example grounding solutions include metal spring-finger contacts or hard fasteners using nuts.

SUMMARY

This section provides a general summary of the disclosure, and is not a comprehensive disclosure of its full scope or all of its features.

Example embodiments of contacts (e.g., gaskets, etc.) are provided herein. In one example embodiment, a metallized film-over-foam contact suitable for circuit grounding of surface mount technology devices generally includes a resilient core member, a solderable electrically conductive layer, and an adhesive bonding the solderable electrically conductive layer to the resilient core member. The adhesive has no more than a maximum of 900 parts per million chlorine, no more than a maximum of 900 parts per million bromine, and no more than a maximum of 1,500 parts per million total halogens.

In some aspects, the contact may have a flame rating of V-0 under Underwriter's Laboratories (UL) Standard No. 94. In some aspects, the contact may have a flame rating of V-1 under Underwriter's Laboratories (UL) Standard No. 94. In some aspects, the contact may have a flame rating of V-2 under Underwriter's Laboratories (UL) Standard No. 94. In some aspects, the contact may have a flame rating of HB under Underwriter's Laboratories (UL) Standard No. 94.

In some aspects, the resilient core member of the contact may include silicone foam, and the solderable electrically conductive layer may include a metallized film comprising copper and tin. And, in some aspects, the resilient core member may have a density of about 5 pounds per cubic foot or more (or about 10 pounds per cubic foot or more, or about 15 pounds per cubic foot or more). In some aspects, the solderable electrically conductive layer may include a polyimide film comprising a layer of copper and a layer of tin, and the layer of copper may be formed on the polyimide film and the layer of tin may be formed over the layer of copper. In other aspects, the resilient core member of the contact may include urethane foam, etc.

In some aspects, the contact may have a surface resistance of less than about 0.07 ohms per square. In some aspects, the contact may be reflow tunnel compatible to about 245 degrees Celsius. In some aspects, the contact may include a pressure sensitive adhesive coupled to at least part of the solderable electrically conductive layer, and configured to couple the contact to a surface of a printed circuit board. In some aspects, the contact may have a generally hourglass cross-sectional shape.

In some aspects, the resilient core member of the contact may have no more than a maximum of 900 parts per million chlorine, no more than a maximum of 900 parts per million bromine, and no more than a maximum of 1,500 parts per million total halogens; and/or the solderable electrically conductive layer of the contact may have no more than a maximum of 900 parts per million chlorine, no more than a maximum of 900 parts per million bromine, and no more than a maximum of 1,500 parts per million total halogens. In some aspects, the contact may have no more than a maximum of 900 parts per million chlorine, no more than a maximum of 900 parts per million bromine, and no more than a maximum of 1,500 parts per million total halogens. In some aspects, the contact may have no more than a maximum of 50 parts per million chlorine and no more than a maximum of 50 parts per million bromine. In some aspects, the resilient core member, the solderable electrically conductive layer, and/or the adhesive of the contact may be entirely free of halogen. In some aspects, the contact may be free of red phosphorus flame retardant and/or expandable carbon graphite and/or antimony. In some aspects, the contact may include no more than a maximum of about 1,000 parts per million of antimony. In some aspects, the resilient core member of the contact may be free of flame retardant added thereto.

In some aspects, the contact may consist of only three layers, including a first layer defined solely by the resilient core member, a second layer defined solely by the adhesive, and a third layer defined solely by the solderable electrically conductive layer. As such, the contact may consist of only the resilient core member, the adhesive, and the solderable electrically conductive layer.

In another example embodiment, a halogen-free metallized film-over-foam contact suitable for circuit grounding of surface mount technology devices generally includes a resilient core member, a metal composition film, and an adhesive bonding the metal composition film to the resilient core member. The resilient core member is free of flame retardant added thereto. And, the resilient core member, the metal composition film, and the adhesive combined have no more than a maximum of 900 parts per million chlorine, no more than a maximum of 900 parts per million bromine, and no more than a maximum of 1,500 parts per million total halogens such that the contact is halogen free.

In some aspects, the contact may have a flame rating of V-0 under Underwriter's Laboratories (UL) Standard No. 94. In some aspects, the contact may have a flame rating of V-1 under Underwriter's Laboratories (UL) Standard No. 94. In some aspects, the contact may have a flame rating of V-2 under Underwriter's Laboratories (UL) Standard No. 94. In some aspects, the contact may have a flame rating of HB under Underwriter's Laboratories (UL) Standard No. 94.

In some aspects, the contact may have a surface resistance of less than about 0.07 ohms per square. In some aspects, the contact may be reflow tunnel compatible to about 245 degrees Celsius. In some aspects, the contact may include a pressure sensitive adhesive coupled to at least part of the solderable electrically conductive layer, and configured to couple the contact to a surface of a printed circuit board. In some aspects, the contact may have a generally hourglass cross-sectional shape.

In some aspects, the resilient core member of the contact may include silicone foam, and the solderable electrically conductive layer may include a metallized film comprising copper and tin. And, in some aspects, the resilient core member may have a density of about 5 pounds per cubic foot or more (or about 10 pounds per cubic foot or more, or about 15 pounds per cubic foot or more). In some aspects, the solderable electrically conductive layer may include a polyimide film comprising a layer of copper and a layer of tin, and the layer of copper may be formed on the polyimide film and the layer of tin may be formed over the layer of copper. In other aspects, the resilient core member of the contact may include urethane foam, etc.

In some aspects, the resilient core member of the contact may have no more than a maximum of 900 parts per million chlorine, no more than a maximum of 900 parts per million bromine, and no more than a maximum of 1,500 parts per million total halogens; and/or the solderable electrically conductive layer of the contact may have no more than a maximum of 900 parts per million chlorine, no more than a maximum of 900 parts per million bromine, and no more than a maximum of 1,500 parts per million total halogens. In some aspects, the contact may have no more than a maximum of 900 parts per million chlorine, no more than a maximum of 900 parts per million bromine, and no more than a maximum of 1,500 parts per million total halogens. In some aspects, the contact may have no more than a maximum of 50 parts per million chlorine and no more than a maximum of 50 parts per million bromine. In some aspects, the resilient core member, the solderable electrically conductive layer, and/or the adhesive of the contact may be entirely free of halogen. In some aspects, the contact may be free of red phosphorus flame retardant and/or expandable carbon graphite and/or antimony. In some aspects, the contact may include no more than a maximum of about 1,000 parts per million of antimony. In some aspects, the resilient core member of the contact may be free of flame retardant.

In some aspects, the contact may consist of only three layers, including a first layer defined solely by the resilient core member, a second layer defined solely by the adhesive, and a third layer defined solely by the solderable electrically conductive layer. As such, the contact may consist of only the resilient core member, the adhesive, and the solderable electrically conductive layer.

In another example embodiment, a method of installing a halogen free metallized film-over-foam contact to a surface of a printed circuit board generally includes soldering an electrically conductive layer of the halogen free contact to a surface of a printed circuit board, whereby an electrical pathway is established from the printed circuit board to the contact through the electrically conductive layer.

In some aspects, the contact includes a silicone foam core and the electrically conductive layer includes a metalized film. Here, the metalized film may surround at least part of the silicone foam core. And, in some aspects, the resilient core member may have a density of about 5 pounds per cubic foot or more (or about 10 pounds per cubic foot or more, or about 15 pounds per cubic foot or more).

In some aspects, the method may also include placing the contact using a surface mount technology machine onto a ground trace of the printed circuit board, where the ground trace is pre-screened with solder paste. In some aspects, the method may also include performing a solder reflow operation while the contact is on the solder paste to thereby solder the contact to the ground trace of the printed circuit board.

In some aspects, the contact may have a flame rating of V-0 under Underwriter's Laboratories (UL) Standard No. 94. In some aspects, the contact may have a flame rating of V-1 under Underwriter's Laboratories (UL) Standard No. 94. In some aspects, the contact may have a flame rating of V-2 under Underwriter's Laboratories (UL) Standard No. 94. In some aspects, the contact may have a flame rating of HB under Underwriter's Laboratories (UL) Standard No. 94.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 13:
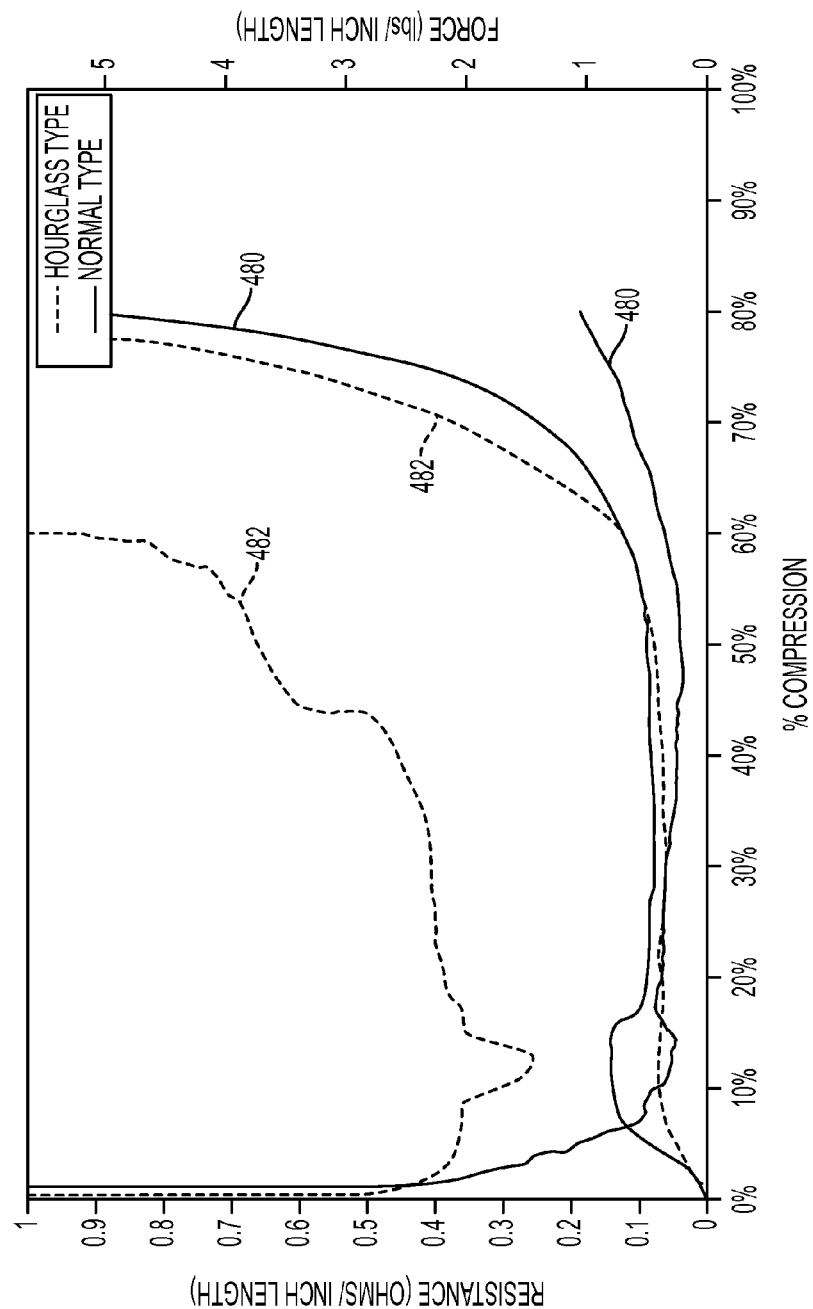
Figure 14:
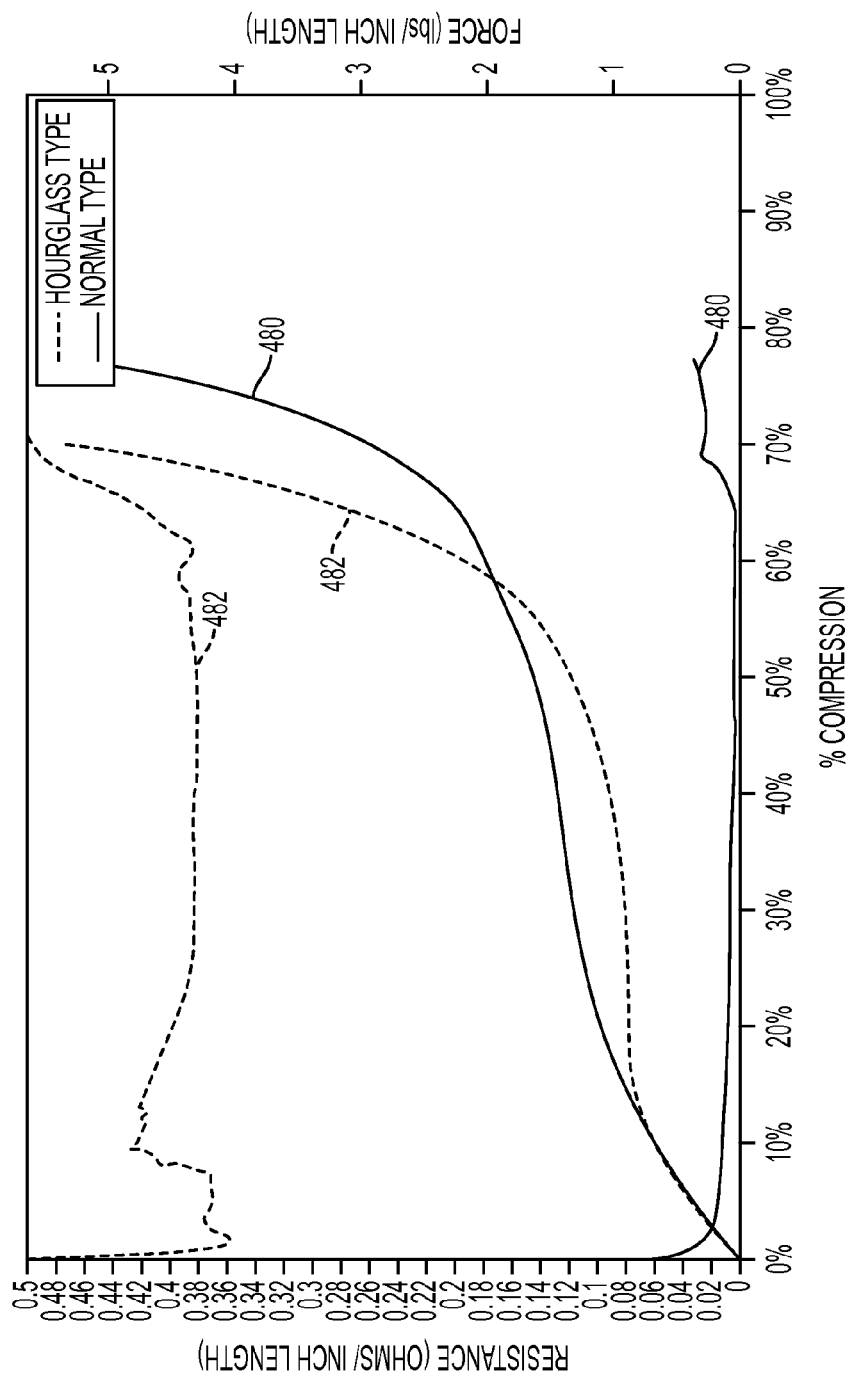
Figure 15:
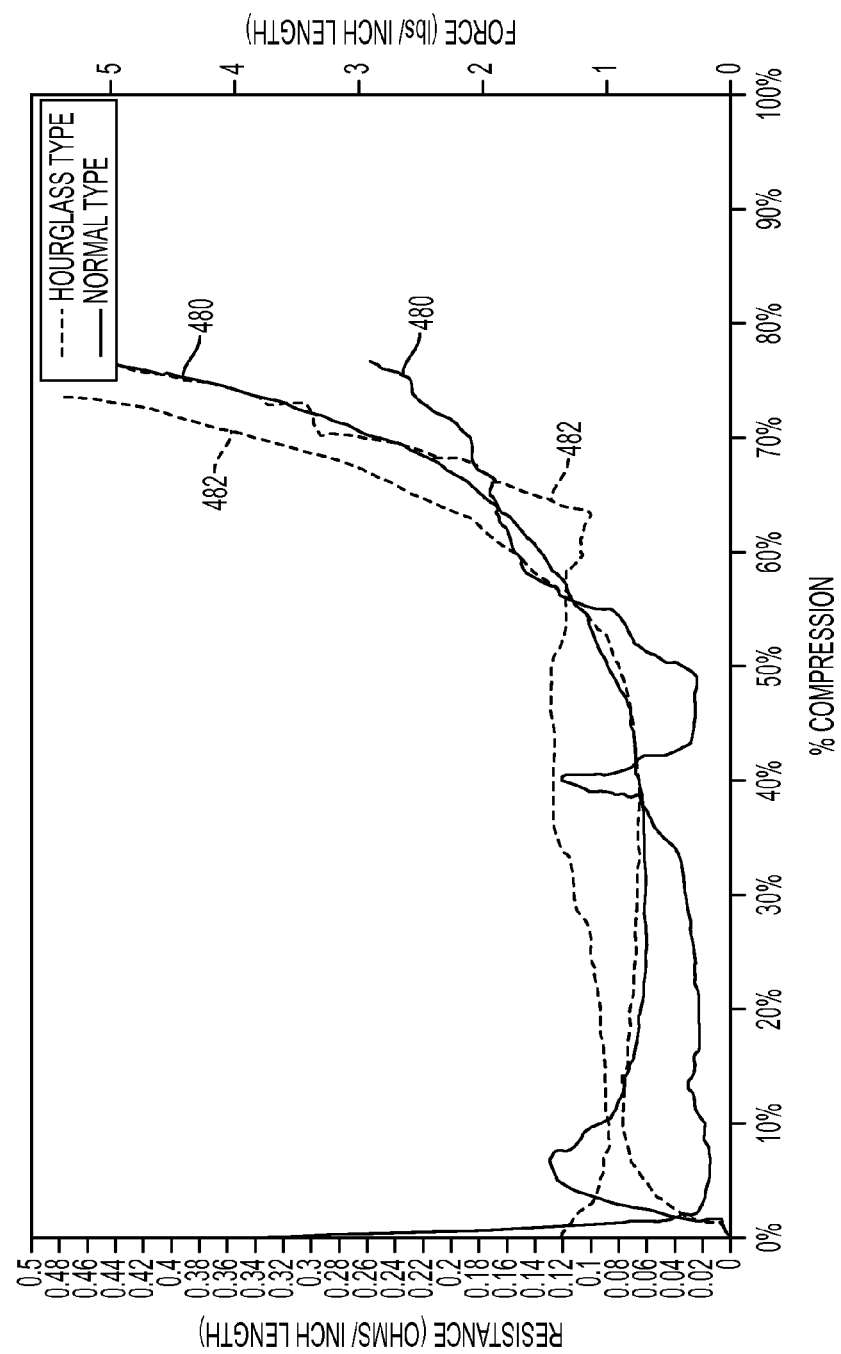
Figure 16:
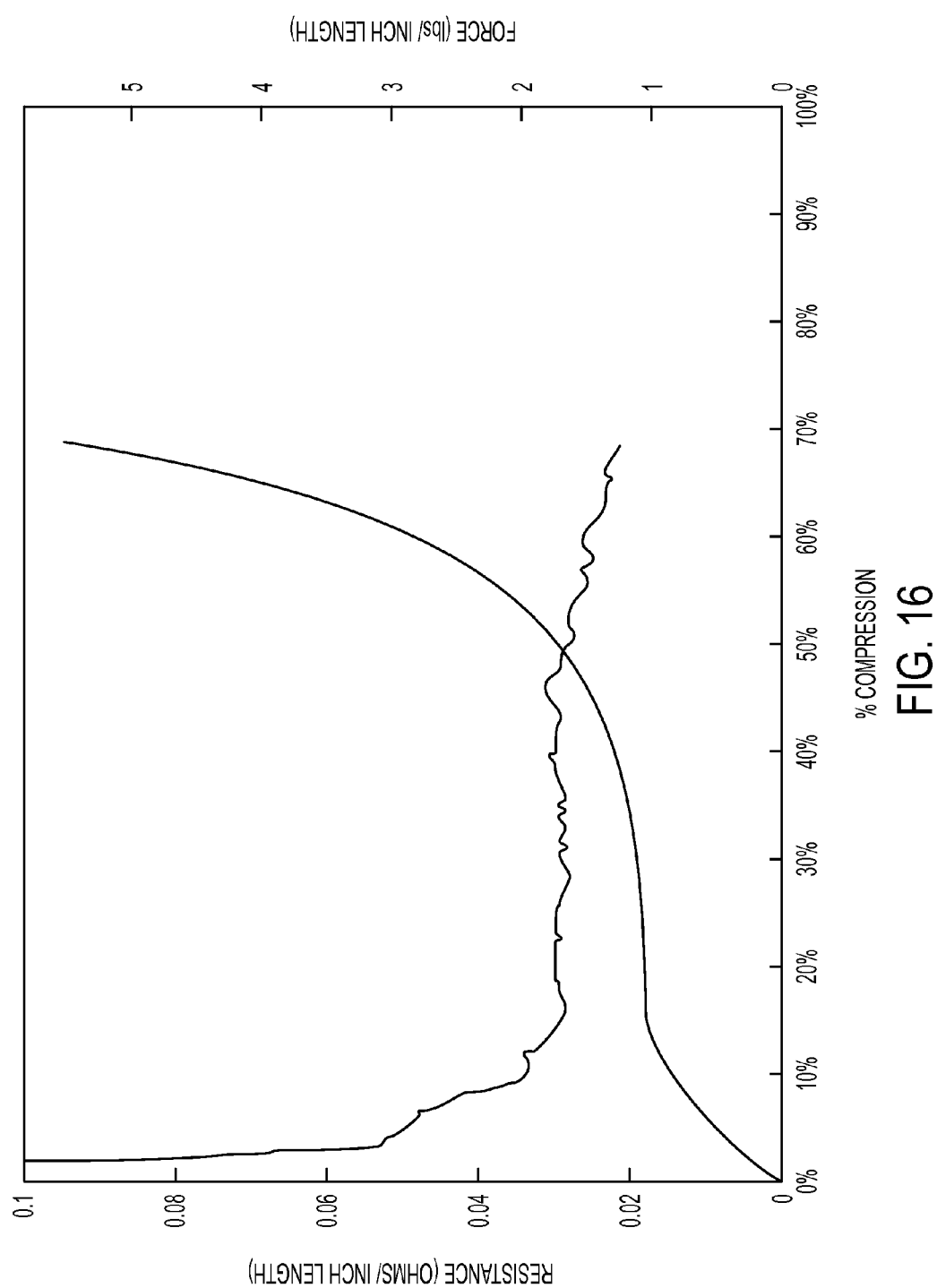

FIG. 13 is a line graph illustrating electrical resistance (in ohms per inch length) and compression force (in pounds per inch length) for two example contacts of the present disclosure having the same constructions but different shapes, and where the two contacts were each sized with a thickness of about 5 millimeters, a width of about 5 millimeters, and a length of about 5 millimeters;

FIG. 14 is a line graph illustrating electrical resistance (in ohms per inch length) and compression force (in pounds per inch length) for two example contacts of the present disclosure again having the same constructions but different shapes, and where the two contacts were each sized with a thickness of about 5 millimeters, a width of about 10 millimeters, and a length of about 5 millimeters;

FIG. 15 is a line graph illustrating electrical resistance (in ohms per inch length) and compression force (in pounds per inch length) for two example contacts of the present disclosure again having the same constructions but different shapes, and where the two contacts were each sized with a thickness of about 10 millimeters, a width of about 10 millimeters, and a length of about 10 millimeters; and FIG. 16 is a line graph illustrating resistance (in ohms per inch length), force (in pounds per inch length), and percent compression for an example contact of the present disclosure.

Corresponding reference numerals indicate corresponding parts throughout the several views of the drawings.

DETAILED DESCRIPTION

Fingerstock gaskets are commonly soldered to printed circuit boards (PCBs) of electronic devices for providing electromagnetic shielding or grounding. But the inventors hereof have recognized that at least some conventional fingerstock gaskets may be easily fractured. Fabric-over-foam (FOF) gaskets are also used to provide electromagnetic shielding or grounding for electronic devices. But the inventors hereof have recognized that while conventional FOF gaskets tend to have better elasticity and are less easily fractured than fingerstock gaskets, FOF gaskets are not solderable to PCBs.

After recognizing the above drawbacks, the inventors hereof developed and disclose herein example embodiments of contacts (e.g., gaskets, etc.), configured for use as surface mount devices (SMD) with surface mount technologies (SMT) (e.g., contacts configured for use as SMD contacts, etc. and suitable for use in providing grounding and/or shielding functions). For example, the contacts can be surface mounted to surfaces of PCBs by soldering, etc. (e.g., to solder pads of the PCBs, ground traces of the PCBs, etc.). In addition, example embodiments of the contacts may be formed from environmentally friendly materials (e.g., halogen-free flame or fire retardants, etc.) and/or may have flame ratings of at least V-0 under the Underwriters Laboratories Standard No. 94, "Tests for Flammability of Plastic Materials for Parts in Devices and Appliances" ($5^{th}$ Edition, Oct. 29, 1996). Further, example embodiments of the contacts may retain various advantages associated with traditional FOF gaskets (e.g., good elasticity, etc.) and various advantages associated with fingerstock gaskets (e.g., solderability, etc.), while avoiding the above drawbacks such as the inability of FOF gaskets to be soldered and the relatively easy fracturability of fingerstock gaskets and tendency to cut the fingers of those installing the fingerstock.

According to various aspects, there are disclosed herein example embodiments of contacts (e.g., metallized film-over-foam contacts, SMD contacts, metallized film-over-foam SMD contacts, grounding contacts, etc.) suitable for providing grounding and/or shielding functions. The contacts generally include resilient cores with electrically conductive layers positioned, provided, deposited, coated, plated, wrapped, etc. around the resilient cores. And, in various embodiments, the electrically conductive layers of the contacts are coupled to the resilient cores with adhesives. The contacts can be used in desired applications such as, for example, cabinets (e.g., telecommunications cabinets, etc.) televisions, medical equipment, servers, printers, computers, networking equipment, projectors, etc.

Example embodiments of the contacts can be used as ground circuits of PCBs, for example, in SMT processes (e.g., as SMD contacts, etc.) for constructing electronic circuits, etc. In these embodiments, the contacts are configured to mount to desired surfaces of the PCBs (e.g., directly to surfaces of the PCBs, to pads coupled to surfaces of the PCBs, etc.) to electrically connect the contacts to the PCBs (e.g., to provide grounding functions, etc.). To accomplish this, the electrically conductive layers of the contacts may comprise metallized films that allow the contacts to be attached, for example, by solder, conductive adhesives, etc. to the surfaces of the PCBs. The metallized films may include, for example, polymeric films (e.g., polyimide (PI) films, etc.) comprising one or more suitable metals (e.g., copper, tin, aluminum, nickel, silver, palladium aluminum, alloys, combinations thereof, etc.) provided thereto by processes such as plating, sputtering (e.g., film deposition, vapor deposition, etc.), combinations thereof, etc.

Example embodiments of the contacts are also able to achieve desired flame ratings under the Underwriters Laboratories Standard No. 94, "Tests for Flammability of Plastic Materials for Parts in Devices and Appliances" ($5^{th}$ Edition, Oct. 29, 1996) (hereinafter, UL-94). For example, some contacts are able to achieve higher flame ratings of V-0. Other contacts are only able to achieve lower flame ratings, such as V-1, V-2, HB, or HF-1. Some example embodiments of the contacts may be able to achieve these desired flame ratings to minimum thicknesses of the contacts of at least about 1 millimeter. The desired UL-94 flame rating of the example embodiments of the contacts can depend, for example, on the particular application or installation for the contacts.

With that said, flame ratings can be determined using UL-94 or using an American Society for Testing and Materials (ASTM) flammability test. UL-94 includes flame ratings of V-0, V-1, V-2, HB, and HF-1, where V-0 is a higher flame rating and HF-1 is a lower flame rating. Notably, the V-0 rating is much more difficult to achieve than the V-1, V-2, HB, and HF-1 ratings. A sample product achieving a lower V-1 rating would not necessarily achieve a higher V-0 rating. Indeed, V-0 and V-1 ratings of sample products are treated as being mutually exclusive for the sample products and are not overlapping. In other words, a sample product identified as having a V-1 rating would not also be considered as having a V-0 rating (otherwise it would be identified as having a V-0 rating).

Under UL-94, flame ratings are determined for a sample product based on burn tests for sets of five specimens of the sample product. Table 1 indicates criteria used for determining UL-94 V-0, V-1, V-2 flame ratings. For example, to achieve a flame rating of V-0, afterflame time ($t_1$ or $t_2$) for each individual specimen of the sample product tested must be less than or equal to 10 seconds, total afterflame time ($t_1$ plus $t_2$ for all five specimens) must be less than or equal to 50 seconds, and afterflame plus afterglow time ($t_2$ plus $t_3$) for each individual specimen must be less than or equal to 30 seconds. At the least, each of these criteria must be satisfied to achieve a flame rating of V-0. As can be appreciated, the V-0 rating is much more difficult to achieve than the V-1 or V-2 ratings.

TABLE 1

| UL-94 CRITERIA CONDITIONS | V-0 | V-1 | V-2 |
|---|---|---|---|
| Afterflame time for each individual specimen $t_1$ or $t_2$ | ≤10 s | ≤30 s | ≤30 s |
| Total afterflame time for any condition set ($t_1$ plus $t_2$ for the five specimens) | ≤50 s | ≤250 s | ≤250 s |
| Afterflame plus afterglow time for each individual Specimen after the second flame application ($t_2$ plus $t_3$) | ≤30 s | ≤60 s | ≤60 s |
| Afterflame or afterglow of any specimen up to the holding clamp | No | No | No |
| Cotton indicator ignited by flaming particles or drops | No | No | Yes |

Further, example embodiments of the contacts are also environmentally friendly and may be viewed as halogen-free per International Electrotechnical Commission (IEC) International Standard IEC 61249-2-21 (page 15, November 2003, First Edition). International Standard IEC 61249-2-21 defines "halogen free" (or free of halogen) for Electrical and Electronic Equipment Covered Under the European Union's Restriction of Hazardous Substances (RoHS) directive as having no more than a maximum of 900 parts per million chlorine, no more than a maximum of 900 parts per million bromine, and no more than a maximum of 1,500 parts per million total halogens. The phrases "halogen free," "free of halogen," and the like are similarly used herein. With that said, in some example embodiments the resilient core members, the electrically conductive layers, or the adhesives of the contacts may each be halogen free. And, in other example embodiments the resilient core members, the electrically conductive layers, and the adhesives, combined, may be halogen free (such that the contacts are halogen free).

Example embodiments of the contacts will now be described more fully with reference to the accompanying drawings.

Figure 1:
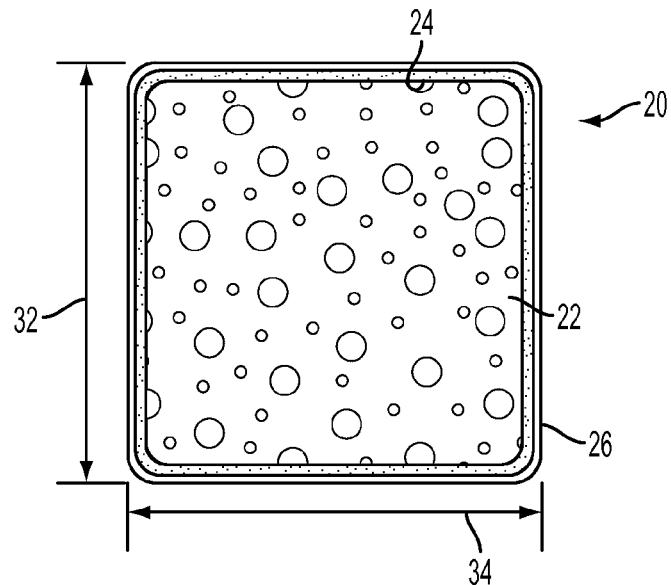
FIG. 1 is a front elevation view of a contact according to an example embodiment of the present disclosure.
Figure 2:
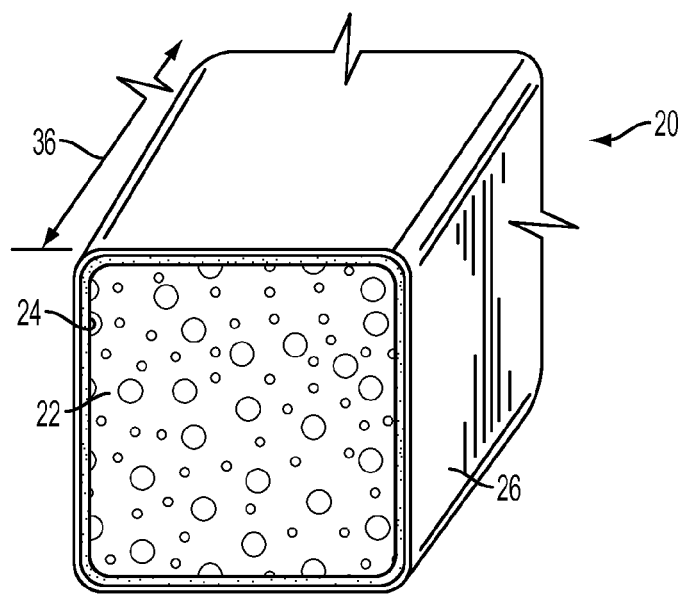
FIG. 2 is a perspective view of the contact of FIG. 1.

FIGS. 1-4 illustrate an example embodiment of a contact 20 (e.g., a SMD contact, etc.) suitable for grounding and/or shielding functions and embodying one or more aspects of the present disclosure. As shown, the contact 20 includes a resilient core member 22, an adhesive 24 (e.g., an epoxy-based adhesive, a hot melt adhesive, a silicone-based adhesive, etc.), and an electrically conductive layer 26. The electrically conductive layer 26 generally surrounds (e.g., is wrapped about, etc.) a perimeter of the resilient core member 22. And, the adhesive 24 (illustrated in an adhesive layer in the figures) bonds the electrically conductive layer 26 to the resilient core member 22. The illustrated contact 20 has a generally square cross-sectional shape, with a generally equal thickness 32 and width 34 (FIG. 1). However, contacts can have other cross-sectional shapes (e.g., rectangular shapes, hourglass shapes, trapezoid shapes, etc.) within the scope of the present disclosure. Further, and without limitation, the contact 20 can have any desired thickness 32 (e.g., 1 millimeter, 3 millimeters, 5 millimeters, 13 millimeters, etc.), width 34 (e.g., 1 millimeter, 3 millimeters, 5 millimeters, 13 millimeters, etc.), and/or length 36 (FIG. 2) within the scope of the present disclosure.

Figure 3:
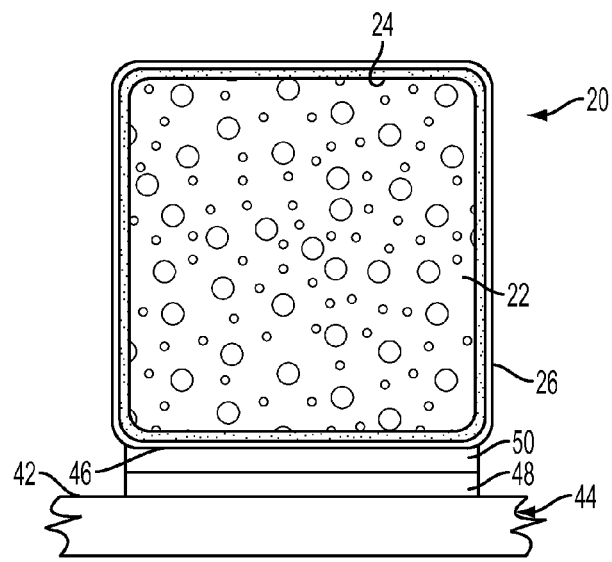
FIG. 3 is a front elevation view of the contact of FIG. 1 shown surface mounted, via solder paste, to a solder pad of a printed circuit board.
Figure 4:
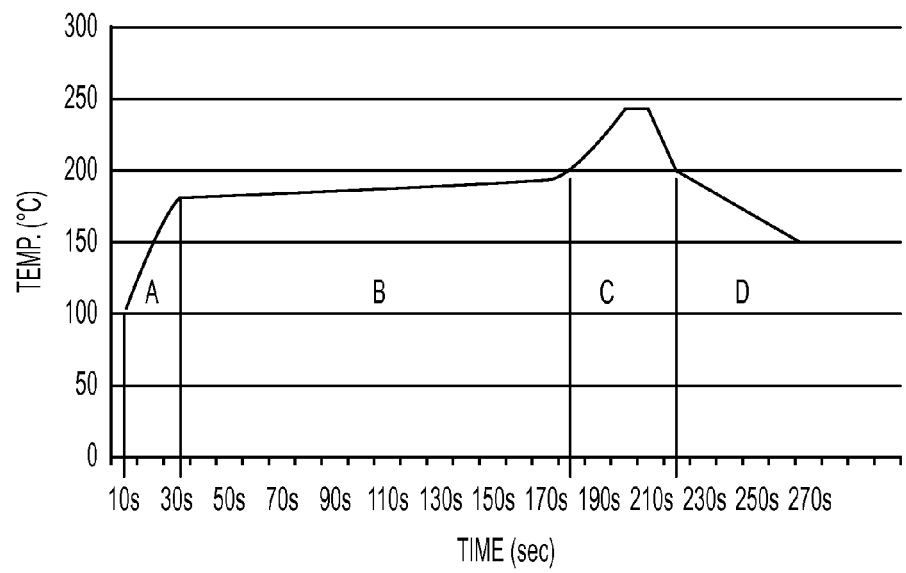
FIG. 4 illustrates example reflow conditions for a reflow soldering operation suitable for coupling the contact of FIG. 3 to the printed circuit board.

With reference now to FIG. 3, and as previously described, the contact 20 can be surface mounted to a surface 42 of a PCB 44 (for electrically coupling the contact 20 to the PCB 44) and used as a ground circuit of the PCB 44, for example, as part of a SMT process for constructing an electronic circuit, etc. The contact 20 may be placed on the surface 42 of the PCB 44 manually or via suitable pick and place equipment (e.g., a gripper, a pneumatic head, a vacuum pick-and-place head, a suction cup pick-and-place head, etc.). In the illustrated embodiment, the contact 20 is surface mounted (at a generally flat surface 46 of the contact 20) to the PCB 44 via solder and a reflow soldering operation (see, FIG. 4 illustrating example solder reflow conditions). In particular, a solder pad 48 (e.g., a tin-lead, silver, gold, etc. plated copper pad, etc.) is provided on the surface 42 of the PCB 44 (e.g., formed as part of the PCB 44, coupled to the PCB 44 by suitable operations, etc.), and the contact 20 is initially coupled to the pad 48 via solder paste 50 provided on the solder pad 48. The PCB 44 and contact 20 are then subjected to a controlled heating process (e.g., in a reflow soldering oven of the reflow soldering operation, etc.) which melts the solder paste 50 and permanently couples the contact 20 to the PCB 44. During the reflow soldering operation, the contact 20 and PCB 44 are subjected to various temperatures ranging from about 20 degrees Celsius (room temperature) up to about 280 degrees Celsius. With that said, it should be appreciated that the components of the contact 20 (e.g., the resilient core member 22, the electrically conductive layer 26, the adhesive 24, etc.) are capable of withstanding these solder reflow conditions and the temperatures (and temperature changes) associated therewith (e.g., temperatures up to at least about 280 degrees Celsius, etc.). As such, the contact 20 can maintain its operational integrity (in terms of structure (e.g., without a bond between the adhesive 24, the resilient core member 22, and the electrically conductive layer 26 failing; without the electrically conductive layer 26 opening or unwrapping; etc.), performance, etc.) following the reflow soldering operation (e.g., the contact 20 is solder reflow processable, the contact 20 is reflow tunnel compatible, etc.).

To allow the contact 20 to be surface mounted to the PCB 44 in the illustrated embodiment, the electrically conductive layer 26 is formed from material that can be soldered to the solder pad 48 (thereby allowing the contact 20 to be coupled to the PCB 44). In this embodiment, the electrically conductive layer 26 comprises a metalized polyimide (PI) film layered (via a sputtering process) with a combination of copper and tin (e.g., a polyimide film plated with about 56 percent copper and about 44 percent tin, a polyimide film plated with other percentages of copper and/or tin and/or other materials, etc.). The copper is provided on the polyimide film, and the tin is provided over the copper. The polyimide film may have any desired thickness (e.g., about 0.025 millimeters, greater than about 0.025 millimeters, less than about 0.025 millimeters, etc.); the copper may be provided in a layer having any desired thickness (e.g., about 0.00006 millimeters, greater than about 0.00006 millimeters, less than about 0.00006 millimeters, etc.); and the tin may be provided in a layer having any desired thickness (e.g., about 0.00004 millimeters, greater than about 0.00004 millimeters, less than about 0.00004 millimeters, etc.). Generally, the copper provides electrical conductivity properties to the contact 20 and the tin provides corrosion resistant properties to the contact 20.

The resilient core member 22 of the illustrated embodiment is formed from a halogen-free foam product (e.g., a silicone foam product, a polyurethane foam product (e.g., SC60CH from The Woodbridge Group (Mississauga, Ontario, Canada), etc.), etc.). In some embodiments, the resilient core member 22 is formed from material (e.g., silicone material, silicone foam material, etc.) that is generally flame retardant. In other embodiments, the resilient core member 22 may be formed from material that is not flame rated and contains no flame retardant added thereto (the material contains no flame retardant additives in the end product, and no flame retardant additives are added prior or during the manufacture of the material) (e.g., the material contains no ammonium compounds, either added thereto prior or during manufacture or in the end product, etc.).

In the illustrated embodiment, the resilient core member 22 includes a silicone foam product having a density of about 15 pounds per cubic foot. In other example embodiments, the resilient core member 22 may include a silicone foam product having other densities (e.g., a density of about 5 pounds per cubic foot or more (e.g., about 5 pounds per cubic foot, about 5.6 pounds per cubic foot, about 6 pounds per cubic foot, about 7 pounds per cubic foot, etc.), etc.) within the scope of the present disclosure. This higher density silicone foam allows the contact 20 to withstand higher temperatures, for example, without the core member 22 melting (e.g., as may happen with foams having lower densities (e.g., densities of about 3.1 pounds per cubic foot or less, etc.). In addition, the silicone foam core member 22 of the illustrated embodiment has very good thermal resistance and low compression set under high temperature (e.g., temperatures associated with reflow soldering, etc.). The silicone foam core member 22 is also relatively soft (e.g., compared to silicone rubber, etc.). As such, the illustrated contact 20, having the silicone foam core member 22, typically requires only slitting or cutting to provide desired dimensions, without requiring new molding.

And, the adhesive 24 of the illustrated embodiment includes a silicone-based adhesive (e.g., a silicone pressure sensitive adhesive, etc.). The silicone based adhesive can help facilitate bonding with the silicone foam of the core member 22. In other embodiments, the adhesive 24 may include an adhesive that is loaded with an effective amount of flame retardant (e.g., halogen-free flame retardant free of halogens such as bromines, chlorines, etc., etc.) to enable the contact 20 to achieve a UL-94 flame rating of V-0, while at the same time having good bond strength and retaining properties suitable (e.g., bulk resistivity, etc.) for the desired contact applications. In still other embodiments, contacts may include adhesives such as solvent based polyester adhesives, epoxy-based adhesives, hot melt adhesives, combinations thereof, etc.

With that said, it should be appreciated that the present disclosure is not limited to the particular electrically conductive film, foam core, and/or adhesive described in connection with the contact 20 of this embodiment. Other materials may be used to make electrically conductive layers, resilient core members, and/or adhesives in other embodiments. For example, the particular material(s) used for the electrically conductive layers of the contacts may vary depending on the desired electrical properties (e.g., surface resistivity, electrical conductivity, etc.) and/or abrasion resistance, which, in turn, can depend, for example, on the particular application in which the contacts will be used. In addition, in other example embodiments, adhesives may include flame retardants or, no flame retardants. Further, other adhesives (e.g., epoxy-based adhesives, other polyurethane-based adhesives, etc.) may be used.

The contact 20 of this embodiment is suitable for use with SMT processes (and is solder reflow processable), can achieve a flame rating of V-0 under UL-94, is halogen free as defined by the IEC 61249-2-21 standard, and is RoHS compliant. In addition, example (non-limiting) properties of the illustrated contact 20 include a conductivity (surface resistance) of less than about 0.07 ohms per square, an adhesion power of soldering (e.g., a breakaway resistance, etc.) of greater than about 0.3 kilogram-force, and a hardness (F type) of greater than about 80 degrees. Further, the contact 20 provides almost no difference in compression ratio before and after soldering, and it is also softer and has better force displacement resistance than some conventional contacts. A compression set of the contact 20 before exposure to the reflow soldering operation is less than about 10 percent, and a compression set of the contact 20 after exposure to the reflow soldering operation is also less than about 10 percent (per ASTM D3574 (at 70 degrees Celsius and 22 hours)). In addition, the contact 20 may be used in shielding operations and may provide a shielding effectiveness of at least about 80 decibels. And, a bond strength of the adhesive 24 of the illustrated contact 20 (to both the resilient core member 22 and the electrically conductive layer 26) is at least about 0.05 newton per millimeter (about 5 ounces per inch).

Figure 5:
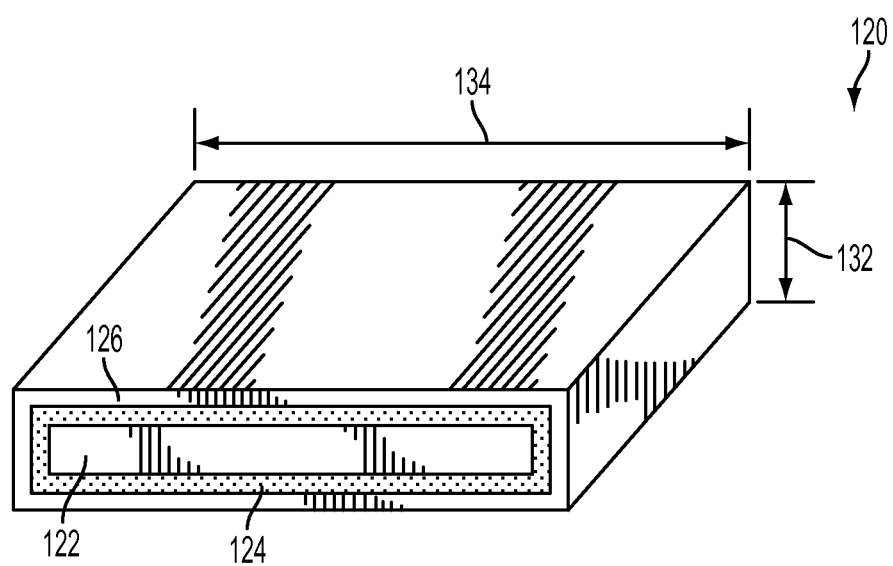
FIG. 5 is a front elevation view of a contact according to another example embodiment of the present disclosure.

FIG. 5 illustrates another example embodiment of a contact 120 suitable for grounding and/or shielding functions and embodying one or more aspects of the present disclosure. The contact 120 of this embodiment is similar to the contact 20 previously described and illustrated in connection with FIGS. 1-4. For example, the contact 120 includes a resilient core member 122, an electrically conductive layer 126 generally surrounding the resilient core member 122, and a layer of adhesive 124 bonding the electrically conductive layer 126 to the resilient core member 122. In addition, the contact 120 is compatible with SMT processes and, as desired, can be surface mounted to a surface of a PCB. Further, the contact 120 can achieve a flame rating of V-0 under UL-94 (e.g., the adhesive 124 may include an effective amount of flame retardant such that the contact 120 has a UL-94 flame rating of V-0, etc.), is halogen free as defined by the IEC 61249-2-21 standard, and is RoHS compliant. In this embodiment, though, the contact 120 has a thickness 132 and width 134 defining a generally rectangular shape.

Figure 6:
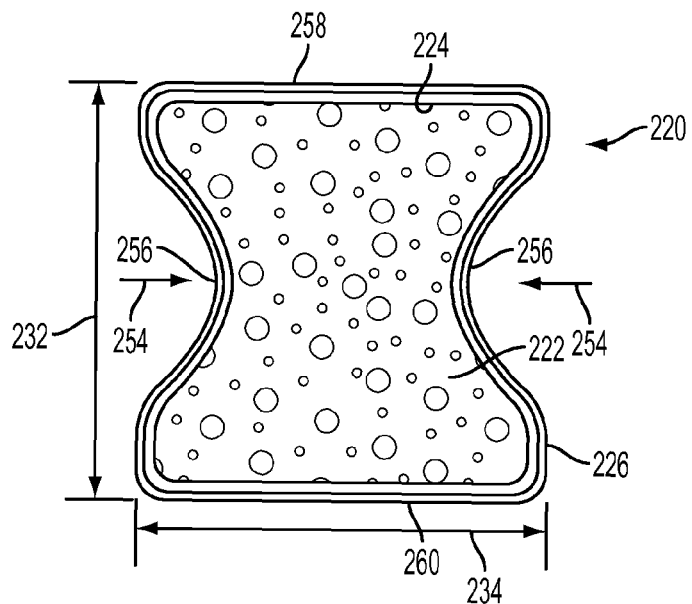
FIG. 6 is a front elevation view of a contact according to yet another example embodiment of the present disclosure.
Figure 7:
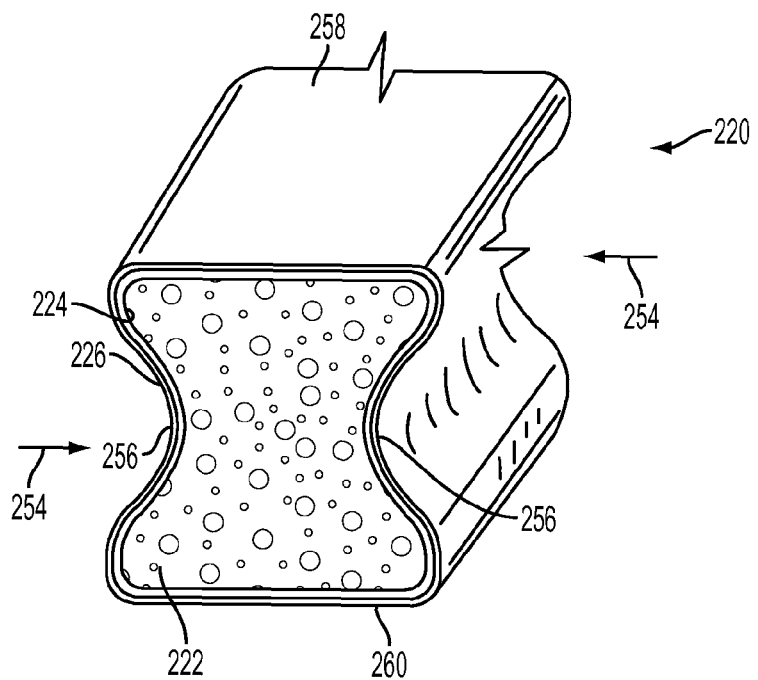
FIG. 7 is a perspective view of the contact of FIG. 6.

FIGS. 6 and 7 illustrate yet another example embodiment of a contact 220 suitable for grounding and/or shielding functions and embodying one or more aspects of the present disclosure. The contact 220 of this embodiment is similar to the contact 20 previously described and illustrated in connection with FIGS. 1-4. For example, the contact 220 includes a resilient core member 222, an electrically conductive layer 226 generally surrounding the resilient core member 222, and a layer of adhesive 224 bonding the electrically conductive layer 226 to the resilient core member 222. In addition, the contact 220 is compatible with SMT processes and, as desired, can be surface mounted to a surface of a PCB. Further, the contact 220 can achieve a flame rating of V-0 under UL-94 (e.g., the adhesive 224 may include an effective amount of flame retardant such that the contact 220 has a UL-94 flame rating of V-0, etc.), is halogen free as defined by the IEC 61249-2-21 standard, and is RoHS compliant.

In this embodiment, though, the contact 220 has a thickness 232 and width 234 defining a generally hourglass shape. The inventors hereof have discovered that the contact 220, having the generally hourglass shape, deforms laterally inwardly (see arrows 254) at side portions 256 of the contact 220 when a force (e.g., a compressing force, etc.) is applied to a top portion 258 and/or a bottom portion 260 of the contact 220 (e.g., compressing the contact 220 between the top and bottom portions 258, 260, etc.). As such, when installed to a PCB (e.g., surface mounted to a surface of the PCB, etc.), the contact 220 does not interfere with surrounding, adjacent components following application of the force to the contact 220 (and following subsequent compression of the contact 220), as compared to square shaped contacts, rectangular shaped contacts, etc. which may deform laterally outwardly at side portions of the contacts when compressing forces are applied to top and/or bottom portions of the contacts. Thus, as compared to the square shaped contacts, rectangular shaped contacts, etc. (which typically require larger clearances when installed to PCBs to avoid contact with nearby components, and possible electrical shorts, upon such compression), the hourglass shaped contact may be more suitable for use in smaller applications.

Figure 8:
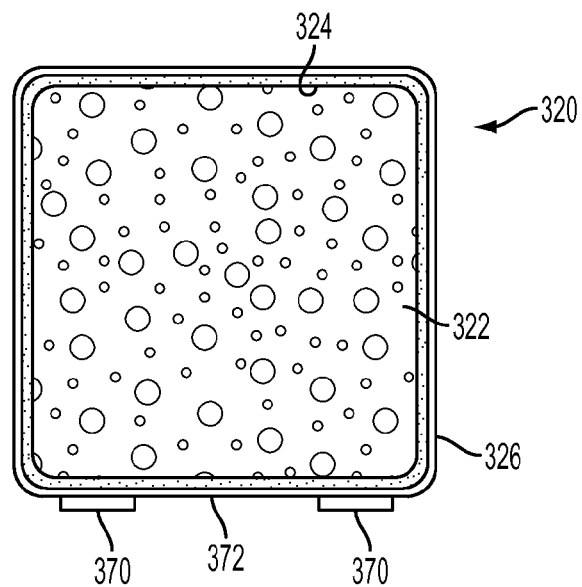
FIG. 8 is a front elevation view of a contact according to another example embodiment of the present disclosure.
Figure 9:
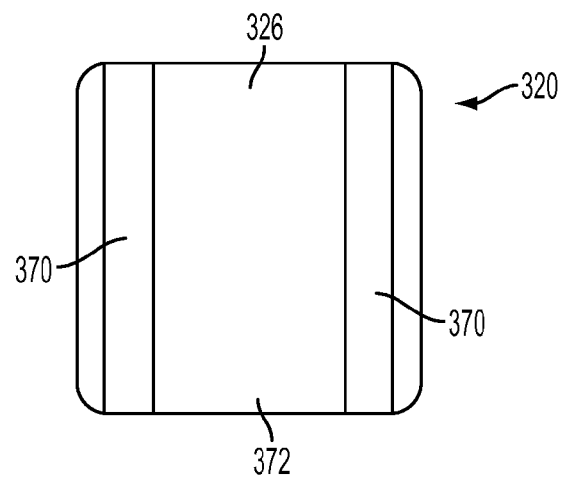
FIG. 9 is a bottom plan view of the contact of FIG. 8.

FIGS. 8 and 9 illustrate yet another example embodiment of a contact 320 suitable for grounding and/or shielding functions and embodying one or more aspects of the present disclosure. The contact 320 of this embodiment is similar to the contact 20 previously described and illustrated in connection with FIGS. 1-4. For example, the contact 320 includes a resilient core member 322, an electrically conductive layer 326 generally surrounding the resilient core member 322, and a layer of adhesive 324 bonding the electrically conductive layer 326 to the resilient core member 322. In addition, the contact 320 is compatible with SMT processes and, as desired, can be surface mounted to a surface of a PCB. Further, the contact 320 can achieve a flame rating of V-0 under UL-94 (e.g., the adhesive 324 may include an effective amount of flame retardant such that the contact 320 has a UL-94 flame rating of V-0, etc.), is halogen free as defined by the IEC 61249-2-21 standard, and is RoHS compliant.

In this embodiment, the contact 320 includes adhesive strips 370 (e.g. pressure sensitive adhesive (PSA) strips, conductive pressure sensitive adhesive (CPSA) strips, etc.) located on a surface 372 (e.g., along a bottom surface, along a seam side, etc.) of the contact 320. These adhesive strips 370 can be used to help hold the contact 320 in place on a PCB prior to, and in preparation for, the reflow soldering operation (e.g., against inadvertently moving, tipping, etc.). The adhesive strips 370 can also be used to help ensure that the particular surface 372 (e.g., the seam side, etc.) of the contact 320 is coupled to the surface of the PCB (thereby lessening the possibility of the contact 320 opening at the seam (e.g., lessening the possibility of the electrically conductive layer 326 unwrapping, etc.) after exposure to heat). While adhesive strips 370 are provided in the illustrated embodiment, other shapes of the adhesive may be used.

The adhesive strips 370 can be located in any desired manner, fashion, orientation, etc. along the surface 372 of the contact 320, and can provide coverage ranges anywhere from about 10 percent to about 100 percent. When the adhesive strips 370 cover about 100 percent of the surface 372 of the contact 320, CPSA strips may be used and relied upon for desired electrical contact with a PCB, and soldering may be eliminated. When the adhesive strips 370 cover less than about 70 percent of the surface 372 of the contact 370, PSA strips or CPSA strips may be used in combination with soldering for making desired electrical contact with a PCB.

In addition, the adhesive strips 370 may include (e.g., may be filled with, etc.) solder particles that can be used to permanently attach the contact 320 to a PCB (following reflow soldering). Here, the adhesive strips 370 with the solder particles can replace solder paste typically used when surface mounting the contact 320 to a PCB. The solder particles can include materials suitable for soldering.

Figure 10:
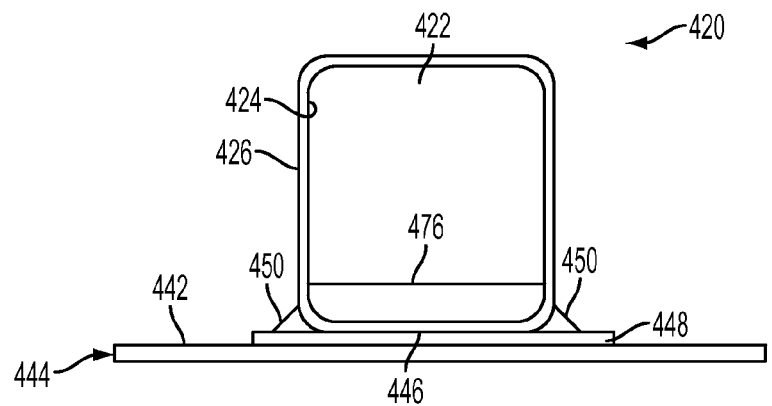
FIG. 10 is a front elevation view of a contact according to another example embodiment of the present disclosure shown surface mounted, via solder paste, to a solder pad of a printed circuit board.

FIG. 10 illustrates another example embodiment of a contact 420 suitable for grounding and/or shielding functions and embodying one or more aspects of the present disclosure. The contact 420 of this embodiment is similar to the contact 20 previously described and illustrated in connection with FIGS. 1-4. For example, the contact 420 includes a resilient core member 422, an electrically conductive layer 426 (e.g., a metalized electrically conductive layer, etc.) generally surrounding the resilient core member 422, and a layer of adhesive 424 bonding the electrically conductive layer 426 to the resilient core member 422. In addition, the contact 420 can achieve a flame rating of V-0 under UL-94 (e.g., the adhesive 424 may include an effective amount of flame retardant such that the contact 420 has a UL-94 flame rating of V-0, etc.), is halogen free as defined by the IEC 61249-2-21 standard, and is RoHS compliant.

The contact 420 of this embodiment is also compatible with SMT processes. For example, a lower surface 446 of the contact 420 can be surface mounted to a surface 442 of a PCB 444 (as viewed in FIG. 10) for electrically coupling the contact 420 to the PCB 444. As such, the contact 420 can be used as a ground circuit of the PCB 444, for example, as part of a SMT process for constructing an electronic circuit, etc. The contact 420 may be placed on the surface 442 of the PCB 444 manually or via suitable pick and place equipment (e.g., a gripper, a pneumatic head, a vacuum pick-and-place head, a suction cup pick-and-place head, etc.). In the illustrated embodiment, the contact 420 is surface mounted to the PCB 444 via a soldering operation. In particular, a solder pad 448 (e.g., a tin-lead, silver, gold, etc. plated copper pad, etc.) is provided along the lower surface of the PCB 444 (e.g., formed as part of the PCB 444, coupled to the PCB 444 by suitable operations, etc.), and the contact 420 is initially coupled to the pad 448 via solder paste 450 provided on the solder pad 448. The PCB 444 and contact 420 are then subjected to a controlled heating process (e.g., in a reflow soldering oven of a reflow soldering operation, etc.) which melts the solder paste 450 and permanently couples the contact 420 to the PCB 444.

In this embodiment, the contact 420 includes a stiffener 476 located generally within the contact 420 and toward the lower surface 446 of the contact 420 (as viewed in FIG. 10). The stiffener 476 operates to provide a generally rigid structure to the contact 420 along the electrically conductive layer 426. In addition, the stiffener 476 is located between the electrically conductive layer 426 of the contact 420 and the resilient core member 422. As such, the stiffener 476 also allows/accommodates compression of the resilient core member 422 during instillation, use, etc. of the contact 420, while helping maintain the original configuration (e.g., shape, integrity, etc.) of the lower surface 446 of the contact 420 (e.g., of the electrically conductive layer 426 of the contact 420 coupled to the PCB 444, etc.).

With that said, use of the stiffener 476 may help inhibit cracking of the solder paste 450 that couples the contact 420 to the PCB 444. Such cracking can result after the contact 420 is coupled to the PCB 444 and the contact 420 is then compressed and/or moved (e.g., slid, etc.) during assembly or use (e.g., when other components engage the contact 420, etc.). Such cracking can undesirably reduce conductivity of the contact 420. As noted above, the stiffener 476 helps maintain the original configuration (e.g., shape, integrity, etc.) of the lower surface 446 of the contact 420 (e.g., of the electrically conductive layer 426 of the contact 420 coupled to the PCB 444, etc.) when such compression of the resilient core member 422 occurs, thereby inhibiting occurrence of this cracking of the solder paste 450. Use of the stiffener 476 may also help improve peel strength of the contact 420 and improve durability of the contact 420.

In the illustrated embodiment, the stiffener 476 is formed from a resin material. However, stiffeners could be formed from other suitable materials within the scope of the present disclosure. Also in the illustrated embodiment, the stiffener 476 has a thickness dimension that is greater than a corresponding thickness dimension of the solder paste 450 coupling the contact 420 to the PCB 444. However, in other example embodiments, contacts may include stiffeners with other thickness dimensions within the scope of the present disclosure.

Figure 11:
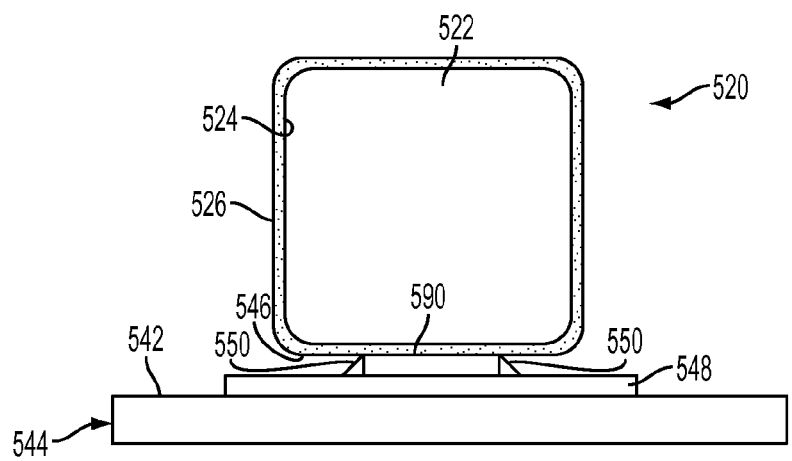
FIG. 11 is a front elevation view of another contact according to an example embodiment of the present disclosure shown surface mounted, via solder paste, to a solder pad of a printed circuit board.

FIG. 11 illustrates another example embodiment of a contact 520 suitable for grounding and/or shielding functions and embodying one or more aspects of the present disclosure. The contact 520 of this embodiment is similar to the contact 20 previously described and illustrated in connection with FIGS. 1-4. For example, the contact 520 includes a resilient core member 522, an electrically conductive layer 526 (e.g., a metalized electrically conductive layer, etc.) generally surrounding the resilient core member 522, and a layer of adhesive 524 bonding the electrically conductive layer 526 to the resilient core member 522. In addition, the contact 520 can achieve a flame rating of V-0 under UL-94 (e.g., the adhesive 524 may include an effective amount of flame retardant such that the contact 520 has a UL-94 flame rating of V-0, etc.), is halogen free as defined by the IEC 61249-2-21 standard, and is RoHS compliant.

The contact 520 of this embodiment is also compatible with SMT processes. For example, a lower surface 546 of the contact 520 can be surface mounted to a surface 542 of a PCB 544 (as viewed in FIG. 11) for electrically coupling the contact 520 to the PCB 544. As such, the contact 520 can be used as a ground circuit of the PCB 544, for example, as part of a SMT process for constructing an electronic circuit, etc. The contact 520 may be placed on the surface 542 of the PCB 544 manually or via suitable pick and place equipment (e.g., a gripper, a pneumatic head, a vacuum pick-and-place head, a suction cup pick-and-place head, etc.). In the illustrated embodiment, the contact 520 is surface mounted to the PCB 544 via a soldering operation. In particular, a solder pad 548 (e.g., a tin-lead, silver, gold, etc. plated copper pad, etc.) is provided along the lower surface of the PCB 544 (e.g., formed as part of the PCB 544, coupled to the PCB 544 by suitable operations, etc.), and the contact 520 is initially coupled to the pad 548 via solder paste 550 provided on the solder pad 548. The PCB 544 and contact 520 are then subjected to a controlled heating process (e.g., in a reflow soldering oven of a reflow soldering operation, etc.) which melts the solder paste 550 and permanently couples the contact 520 to the PCB 544.

In this embodiment, the contact 520 includes a plate 590 located outside of the contact 520 and generally toward the lower surface 546 of the contact 520 (as viewed in FIG. 11). The plate 590 is positioned generally between the contact 520 and the solder pad 548, and the plate 590 is soldered to the contact 520 and the solder pad 548 when coupling the contact 520 to the PCB 544. The plate 590 operates to provide a generally rigid structure to the contact 520 along the electrically conductive layer 526, and also separates the contact 520 from the solder pad 548. In the illustrated embodiment, the plate 590 includes multiple through holes (not visible) to allow the solder paste 550 flow therethrough (from the solder pad 548) to help accommodate coupling the contact 520 to the PCB 544.

With that said, use of the plate 590 may help inhibit cracking of the solder paste 550 coupling the contact 520 to the PCB 544. Such cracking can result after the contact 520 is coupled to the PCB 544 and the contact 520 is then compressed and/or moved (e.g., slid, etc.) during assembly or use (e.g., when other components engage the contact 520, etc.). Such cracking can undesirably reduce conductivity of the contact 520. As noted above, the plate 590 provides a generally rigid structure to the contact 520 along the electrically conductive layer 526 and separates the contact 520 from the solder pad 548. As such, compression of the resilient core member 522 (and any associated movement of the electrically conductive layer 526 along the lower surface 546 of the contact 520) does not influence the solder paste 550 because it is separated therefrom by the plate 590. Thus, occurrence of the cracking described above of the solder paste 550 can be inhibited. Use of the plate 590 may also help improve peel strength of the contact 520 and improve durability of the contact 520.

In the illustrated embodiment, the plate 590 is formed from a metal material (e.g., a heat resistant metal material, etc.), and has a thickness of about 0.1 millimeters. However, plates could be formed from other suitable materials and/or could have other thickness dimensions (e.g., thickness dimensions of less than about 0.1 millimeters, thickness dimensions of greater than about 0.1 millimeters, thickness dimensions between about 0.1 millimeters and about 0.15 millimeters, etc.) within the scope of the present disclosure.

EXAMPLES

The following examples are merely illustrative, and are not limiting to the disclosure in any way.

Example 1

In this example, a flammability test per UL-94 was performed on an example contact of the present disclosure. The contact included a polyether urethane foam core with a metallized tin/copper film bonded thereto by an adhesive. The metallized tin/copper film was formed by a fully sputtering process and comprised a polyimide film having about 56.25 percent copper and 43.75 percent tin.

In addition, in this example the polyether urethane foam used as the core of the contact had the following properties. The foam was free of halogen containing flame retardants, and was free of any visible wrinkles and creases. The foam had a tan color (comprising PANTONE 474C) and pore sizes of not more than 3.0 millimeters. The density of the foam was between about 4.25 and about 4.75 pounds per cubic foot. The hardness (F-type) of the foam was about 85 percent+/−5 percent. The elongation of the foam was greater than about 80 percent. The tensile strength of the foam was greater than about 15 pounds per square inch. The compression strength of the foam was between about 0.5 and 1.5 pounds per square inch at about 50 percent compression. And, the compression set of the foam (per ASTM D3574) was (1) less than about 10 percent at 70 degrees Celsius, 22 hours, and 50% compression deflection, and (2) less than about 20 percent at 70 degrees Celsius, 168 hours, and 50% compression deflection.

And, the adhesive included a solvent based polyurethane adhesive that included about 52.3 percent of an aromatic polyester general purpose adhesive (having about 25 percent solids) (product 4849 from Henkel AG & Co. (Germany)), about 16.9 percent of a first fire retardant additive (product OP 935 from Clariant GmbH (Germany)), about 1.9 percent of a second fire retardant additive (product FR CROS 489 from Budenheim Iberica (Spain)), about 3.0 percent of an epoxy resin (product P-4 from Royce International (United States)) (in a 50 percent by weight blend of Toluene), and about 25.9 percent of toluene (to make the adhesive at a suitable viscosity (e.g., about 3,000 to 5,000 centipoise (cps)). For this adhesive, the percent solids in the dry film, after the solvents evaporate during drying, were about 39.17 percent of the general purpose adhesive, about 50.64 percent of the first fire retardant, about 5.69 percent of the second fire retardant, and about 4.49 percent of the epoxy resin. A crosslinker was then added to the adhesive in this example to help improve temperature resistance.

To make the contact, the adhesive components were mixed together using a suitable laboratory mixer and then coated on silicone-treated release paper using a draw down bar (e.g., having a width dimension of about 10 inches and a length dimension of about 8 inches, etc.) to make an adhesive coating (having a target weight of between about 3 ounces per square yard and about 4 ounces per square yard). The adhesive coating was next dried at a temperature of about 100 degrees Celsius for about 20 minutes to evaporate the toluene. A heat press was then used (at a temperature of about 350 degrees Fahrenheit for a duration of about 5 seconds) to bond the adhesive to the metallized film. The sheets of bonded adhesive and metallized film were then applied to foam core to make the metallized film-over-foam contact for testing.

For the flammability test, five samples of the contact were made for testing. Each of the samples had a thickness of about 3 millimeters. The example results of the flammability test are set forth in Table 2 (and are provided for purposes of illustration only). As indicated in Table 2, the contact of this example achieved a UL-94 flame rating of V-0.

TABLE 2

| Sample | $t_1$ (s) | $t_2$ (s) | $t_3$ (s) | Result |
|---|---|---|---|---|
| 1 | 8.54 | 0 | 0 | V-0 |
| 2 | 7.63 | 0 | 0 | V-0 |
| 3 | 9.52 | 0 | 0 | V-0 |
| 4 | 9.16 | 0 | 0 | V-0 |
| 5 | 7.33 | 5 | 0 | V-0 |

Total Afterflame = 42.18 seconds
UL-94 Flame Rating = V-0

Example 2

In this example, a flammability test per UL-94 was performed on an example contact of the present disclosure. The contact included a polyether urethane foam core with a metallized tin/copper film bonded thereto by an adhesive. The polyether urethane foam core has the same properties as identified in Example 1. The metallized tin/copper film was again formed by a fully sputtering process and comprised a polyimide film having about 56.25 percent copper and 43.75 percent tin. And, the adhesive is the same as used in Example 1 (but without the crosslinker added).

For the flammability test, five samples of the contact were made for testing. Each of the samples were approximately 3 millimeters thick, 13 millimeters wide, and 125 millimeters long. The example results of the flammability test are set forth in Table 3 (and are provided for purposes of illustration only). As indicated in Table 3, the contact of this example achieved a UL-94 flame rating of V-0.

TABLE 3

| Sample | $t_1$ (s) | $t_2$ (s) | $t_3$ (s) | Result |
|---|---|---|---|---|
| 1 | 2.85 | 5.16 | 0 | V-0 |
| 2 | 7.29 | 3.04 | 0 | V-0 |
| 3 | 2.44 | 2.24 | 0 | V-0 |
| 4 | 7.90 | 1.32 | 0 | V-0 |
| 5 | 4.72 | 3.61 | 0 | V-0 |

Total Afterflame = 40.57 seconds
UL-94 Flame Rating = V-0

Example 3

In this example, a flammability test per UL-94 was performed on an example contact of the present disclosure. The contact included a polyether urethane foam core with a metallized tin/copper film bonded thereto by an adhesive. The polyether urethane foam core has the same properties as identified in Example 1. The metallized tin/copper film was again formed by a fully sputtering process and comprised a polyimide film having about 56.25 percent copper and 43.75 percent tin. And, the adhesive is the same as used in Example 1 (but with a different crosslinker added).

For the flammability test, five samples of the contact were made for testing. Each of the samples were approximately 3 millimeters thick. The example results of the flammability test are set forth in Table 4 (and are provided for purposes of illustration only). As indicated in Table 4, the contact of this example achieved a UL-94 flame rating of V-1.

TABLE 4

| Sample | $t_1$ (s) | $t_2$ (s) | $t_3$ (s) | Result |
|---|---|---|---|---|
| 1 | 11.78 | 6.27 | 0 | V-1 |
| 2 | 13.27 | 3.81 | 0 | V-1 |
| 3 | 15.81 | 0 | 0 | V-1 |
| 4 | 8.85 | 2.73 | 0 | V-0 |
| 5 | 6.56 | 0 | 0 | V-0 |

Total Afterflame = 69.08 seconds
UL-94 Flame Rating = V-1

Example 4

In this example, a flammability test per UL-94 was performed on an example contact of the present disclosure. The contact included a polyether urethane foam core with a metallized tin/copper film bonded thereto by an adhesive. The polyether urethane foam core has the same properties as identified in Example 1. The metallized tin/copper film was again formed by a fully sputtering process and comprised a polyimide film having about 56.25 percent copper and 43.75 percent tin. And, the adhesive is the same as used in Example 3.

For the flammability test, five samples of the contact were made for testing. Each of the samples were approximately 5 millimeters thick. The example results of the flammability test are set forth in Table 5 (and are provided for purposes of illustration only). As indicated in Table 5, the contact of this example achieved a UL-94 flame rating of V-1.

TABLE 5

| Sample | $t_1$ (s) | $t_2$ (s) | $t_3$ (s) | Result |
|---|---|---|---|---|
| 1 | 23.94 | 0 | 0 | V-1 |
| 2 | 15.62 | 2.35 | 0 | V-1 |

TABLE 5-continued

| Sample | t₁ (s) | t₂ (s) | t₃ (s) | Result |
|---|---|---|---|---|
| 3 | 19.30 | 5.67 | 0 | V-1 |
| 4 | 17.26 | 0 | 0 | V-1 |
| 5 | 18.91 | 0 | 0 | V-1 |

Total Afterflame = 103.05 seconds
UL-94 Flame Rating = V-1

Example 5

In this example, a flammability test per UL-94 was performed on an example contact of the present disclosure. The contact included a polyether urethane foam core with a metallized tin/copper film bonded thereto by an adhesive. The polyether urethane foam core has the same properties as identified in Example 1. The metallized tin/copper film was again formed by a fully sputtering process and comprised a polyimide film having about 56.25 percent copper and 43.75 percent tin. And, the adhesive is the same as used in Example 1 (but without the crosslinker added thereto).

For the flammability test, three samples of the contact were made for testing each having a 3 millimeter thickness. Three samples of the contact were made for testing each having a 5 millimeter thickness. And, three samples of the contact were made for testing each having a 10 millimeter thickness. The example results of the flammability test are set forth in Tables 6-8 (and are provided for purposes of illustration only). As indicated in Tables 6-8, the contacts of this example, at each of the thicknesses of 3 millimeters, 5 millimeters, and 10 millimeters, achieved a UL-94 flame rating of HB. As a note, the abbreviation "NBTL" in the Burn Rate column of the tables stands for "not burned to line", which is an automatic pass for the horizontal burn test.

TABLE 6

| Sample (3 mm) | Burn Rate (mm/min) | Result |
|---|---|---|
| 1 | NBTL | Pass |
| 2 | NBTL | Pass |
| 3 | NBTL | Pass |

TABLE 7

| Sample (5 mm) | Burn Rate (mm/min) | Result |
|---|---|---|
| 1 | NBTL | Pass |
| 2 | NBTL | Pass |
| 3 | NBTL | Pass |

TABLE 8

| Sample (10 mm) | Burn Rate (mm/min) | Result |
|---|---|---|
| 1 | NBTL | Pass |
| 2 | NBTL | Pass |
| 3 | NBTL | Pass |

Example 6

In this example, a Restriction of Hazardous Substances (RoHS) test was performed on an example contact of the present disclosure. The contact included a polyether urethane foam core with a metallized tin/copper film bonded thereto by adhesive. The polyether urethane foam core has the same properties as identified in Example 2. And, the metallized tin/copper film was again formed by a fully sputtering process and comprised a polyimide film having about 56.25 percent copper and 43.75 percent tin.

For the RoHS test, the contact was analyzed for various metals, polybrominated biphenyls (PBBs), polybrominated diphenyl ethers (PBDEs), and halogens (see, Table 9). Inductively coupled plasma atomic emission spectroscopy (ICP-AES) was used for detecting cadmium, lead, and mercury. Ultraviolet-visible spectroscopy (UV-VIS) was used for detecting hexavalent chromium. Gas chromatography-mass spectrometry (GC-MS) was used for detecting the PBBs and the PBDEs. And, ion chromatography (IC) was used for detecting fluorine, chlorine, and bromine. The example results of the RoHS test are shown in Table 4 (and are provided for purposes of illustration only). As indicated by the Test Result "ND" (no detection) in the Table 9, none of the test items were detected using the above testing methods (ICP-AES, UV-VIS, GC-MS, and IC) and their given method detection limits ("MDL"). Accordingly, none of the items listed in Table 9 were detected in the contact, indicating that the contact is RoHS compliant (as well as halogen free per IEC 61249-2-21). Note that in Table 9 for the method detection limits ("MDL"), 1 milligram per kilogram (mg/kg) is equal to 1 part per million (1 ppm).

TABLE 9

| Test Item | Test Result | MDL |
|---|---|---|
| Cadmium | ND | 2 mg/kg |
| Lead | ND | 2 mg/kg |
| Mercury | ND | 2 mg/kg |
| Hexavalent Chromium | ND | 2 mg/kg |
| Sum of PBBs | ND | — |
| Monobromobiphenyl | ND | 5 mg/kg |
| Dibromobiphenyl | ND | 5 mg/kg |
| Tribromobiphenyl | ND | 5 mg/kg |
| Tetrabromobiphenyl | ND | 5 mg/kg |
| Pentabromobiphenyl | ND | 5 mg/kg |
| Hexabromobiphenyl | ND | 5 mg/kg |
| Heptabromobiphenyl | ND | 5 mg/kg |
| Octabromobiphenyl | ND | 5 mg/kg |
| Nonabromobiphenyl | ND | 5 mg/kg |
| Decabromobiphenyl | ND | 5 mg/kg |
| Sum of PBDEs | ND | — |
| Monobromodiphenyl ether | ND | 5 mg/kg |
| Dibromodiphenyl ether | ND | 5 mg/kg |
| Tribromodiphenyl ether | ND | 5 mg/kg |
| Tetrabromodiphenyl ether | ND | 5 mg/kg |
| Pentabromodiphenyl ether | ND | 5 mg/kg |
| Hexabromodiphenyl ether | ND | 5 mg/kg |
| Heptabromodiphenyl ether | ND | 5 mg/kg |
| Octabromodiphenyl ether | ND | 5 mg/kg |
| Nonabromodiphenyl ether | ND | 5 mg/kg |
| Decabromodiphenyl ether | ND | 5 mg/kg |
| Fluorine | ND | 50 mg/kg |
| Chlorine | ND | 50 mg/kg |
| Bromine | ND | 50 mg/kg |

Example 7

Figure 12:
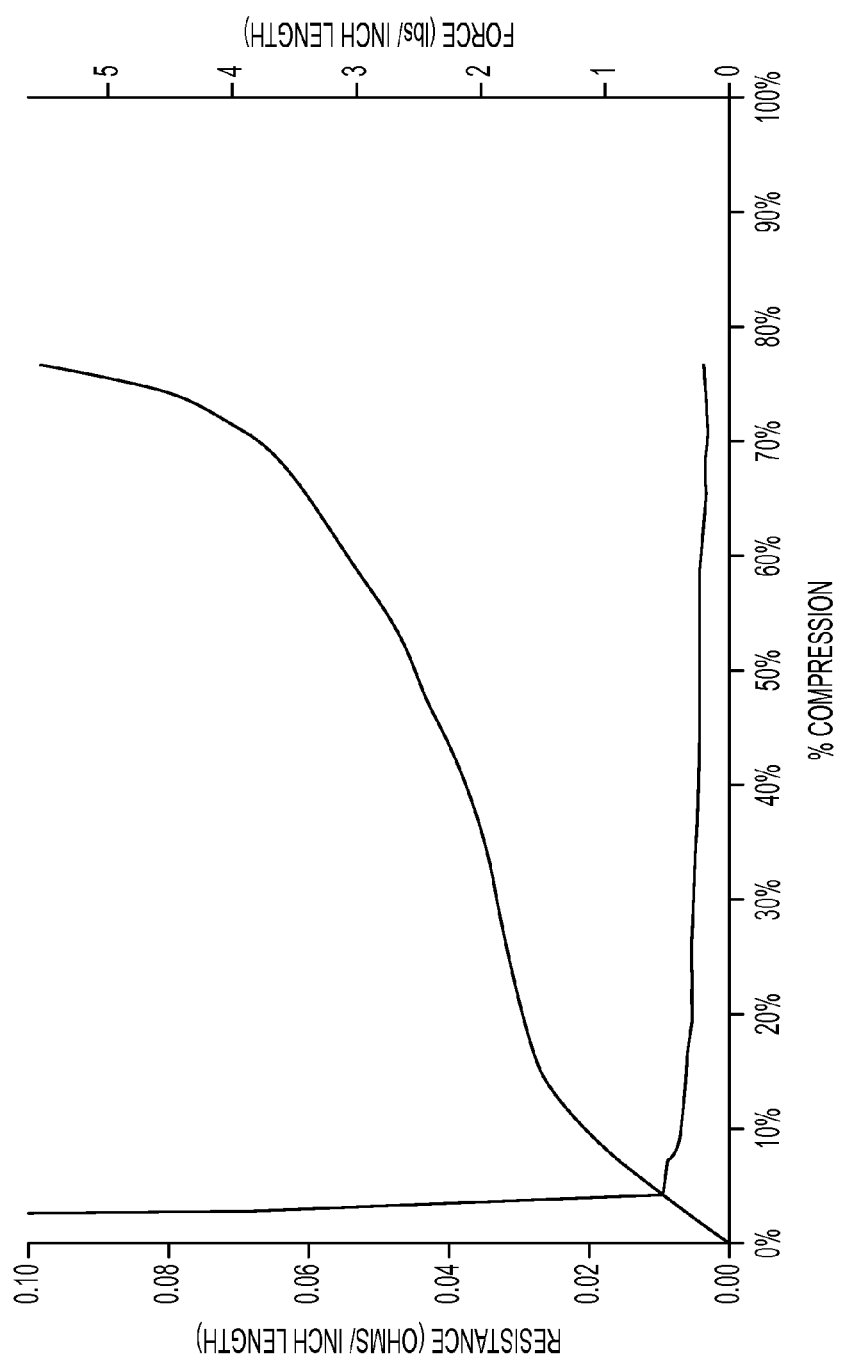
FIG. 12 is a line graph illustrating resistance (in ohms per inch length), force (in pounds per inch length), and compression for an example contact of the present disclosure.

In this example, a force/displacement/electrical resistance test were performed on an example contact of the present disclosure. The contact was sized with a thickness of about 7 millimeters and a width of about 7 millimeters. The results of the test are shown in FIG. 12.

Example 8

In this example, force/displacement/electrical resistance tests were performed on two different shapes of an example contact of the present disclosure. The two different shapes of the contact evaluated included one having a generally square cross-sectional shape (such as the shape of contact 20 illustrated in FIG. 1) and one having a generally hourglass cross-sectional shape (such as the shape of the contact 220 illustrated in FIG. 6).

The example contacts (used for evaluating both shapes) each included a polyether urethane foam core (such as the one described in Example 2) with a metallized tin/copper film bonded thereto by adhesive. Again, the metallized tin/copper film was formed by a fully sputtering process and comprised a polyimide film having about 56.25 percent copper and 43.75 percent tin.

In a first set of force displacement and electrical resistance tests, the two different shaped contacts were both approximately 5 millimeters thick, 5 millimeters wide, and 5 millimeters long. In a second set of force displacement and electrical resistance tests, the two different shaped contacts were both approximately 5 millimeters thick, 10 millimeters wide, and 5 millimeters long. And, in a third set of force displacement and electrical resistance tests, the two different shaped contacts were both approximately 10 millimeters thick, 10 millimeters wide, and 10 millimeters long.

The results of the tests are shown in FIGS. 13-15. FIG. 13 illustrates the results of the first set of tests, FIG. 14 illustrate the results of the second set of tests, and FIG. 15 illustrates the results of the third set of tests. Lines 480 the results for the square shaped contact, and lines 482 illustrate the results for hourglass shaped contact. Generally, in each of the tests, the electrical resistance of the hourglass shaped contact was greater than that of the square shaped contact, while the force displacement for both shapes of the contacts were substantially similar.

Example 9

In this example, a compression set test, a force/displacement/electrical resistance test, and a flammability test per UL-94 were performed on an example contact of the present disclosure. The contact included a silicone foam core with a metallized tin/copper film bonded thereto by a vulcanized silicone adhesive. The metallized tin/copper film was again formed by a fully sputtering process and comprised a polyimide film having about 56.25 percent copper and 43.75 percent tin. The contact had a thickness of about 13 millimeters, a width of about 13 millimeters, and a length of about 13 millimeters. And, the tests were performed on the contact after two exposures to a reflow soldering operation (see, e.g., FIG. 4, etc.).

The compression set test was performed on five samples of the finished contact in accordance with ASTM D3574, modified to 125° C. The results of the compression set test are shown in Table 10 (and are provided for purposes of illustration only). As can be seen, the compression set for each sample was less than 10 percent. And, the results of the force/displacement/electrical resistance test are shown in FIG. 16 (and are provided for purposes of illustration only). For the flammability test, five samples of the contact were made for testing. The example results of the flammability test are set forth in Table 11 (and are provided for purposes of illustration only). As indicated, the contact of this example achieved a UL-94 flame rating of V-0.

TABLE 10

|  | Compression 50% | | | | |
|---|---|---|---|---|---|
| Original Thickness (30 min) (mm) | 13.19 | 13.11 | 13.12 | 13.29 | 13.22 |
| Thickness after 125° C., 22 hrs (mm) | 12.68 | 12.64 | 12.6 | 12.91 | 12.54 |
| Compression Set (%) | 3.87 | 3.59 | 3.96 | 2.86 | 5.14 |
| Average Compression Set (%) |  |  | 3.88 |  |  |

TABLE 11

| Sample | $t_1$ (s) | $t_2$ (s) | $t_3$ (s) | Result |
|---|---|---|---|---|
| 1 | 0.98 | 1.02 | 0 | V-0 |
| 2 | 1.12 | 1.82 | 0 | V-0 |
| 3 | 0 | 2.10 | 0 | V-0 |
| 4 | 0.84 | 2.31 | 0 | V-0 |
| 5 | 0 | 1.16 | 0 | V-0 |

Total Afterflame = 11.35 seconds
UL-94 Flame Rating = V-0

Example 10

In this example, a flammability test per UL-94 was performed on an example contact of the present disclosure. The contact included a silicone foam core with a metallized tin/copper film bonded thereto by a vulcanized silicone adhesive. The metallized tin/copper film was again formed by a fully sputtering process and comprised a polyimide film having about 56.25 percent copper and 43.75 percent tin. The contact had a thickness of about 3 millimeters, a width of about 3 millimeters, and a length of about 3 millimeters. And, the tests were performed on the contact after two exposures to a reflow soldering operation (see, e.g., FIG. 4, etc.). The example results of the flammability test are set forth in Table 12 (and are provided for purposes of illustration only). As indicated, the contact of this example achieved a UL-94 flame rating of V-1.

TABLE 12

| Sample | $t_1$ (s) | $t_2$ (s) | $t_3$ (s) | Result |
|---|---|---|---|---|
| 1 | 10.09 | 3.49 | 0 | V-1 |
| 2 | 13.42 | 0 | 0 | V-1 |
| 3 | 12.24 | 3.48 | 0 | V-1 |
| 4 | 8.78 | 4.21 | 0 | V-0 |
| 5 | 10.79 | 2.85 | 0 | V-1 |

Total Afterflame = 69.35 seconds
UL-94 Flame Rating = V-1

With that said, it should be appreciated that a wide range of materials can be used for the resilient core members, the electrically conductive layers, and the adhesives of the contacts of the present disclosure. By way of example, the resilient core members, the electrically conductive layers, and/or the adhesives of the present disclosure may comprise one or more corresponding materials disclosed in United States Patent Application Publication US2010/0258344 published Oct. 14, 2010, the disclosure of which is incorporated herein by reference in its entirety.

In some example embodiments, the resilient core member may be made of a foam material (e.g., a silicone foam material, a polymeric elastomer material, a cellular polymeric foam such as an open celled foam, a closed cell foam, a urethane foam (e.g., a polyester foam, a polyether foam, a combination thereof, etc.), a polyurethane foam, etc.), a silicone rubber material, etc. And, a scrim (e.g., a polyester scrim, etc.) may be attached to the resilient core member as desired.

In some example embodiments, the resilient core member may comprise a foam material having a compression set (per ASTM D3574 (test D)) of less than about 15% and/or a density of between about 3 pounds per cubic foot and about 7 pounds per cubic foot (e.g., between about 3.5 pounds per cubic foot and about 4.2 pounds per cubic foot, about 5.6 pounds per cubic foot, etc.). In one specific example, a resilient core member may be formed from a halogen-free polyurethane foam product available from The Woodbridge Group (Mississauga, Ontario, Canada) (e.g., product SC60CH, etc.), etc. Here, the foam product used is not flame rated and has the following physical properties: a density of about 3.5 to about 4.2 pounds per cubic foot; a 25% Indentation Force Deflection (IFD) of about 60 to about 80 pounds per 50 square inches; a charcoal color; contains no flame retardant (the foam product contains no flame retardant additives in the end product, and no flame retardant additives are added prior or during the manufacture of the foam product) (e.g., the foam product contains no ammonium compounds, either added thereto prior or during manufacture or in the end product, etc.); a tear strength of at least about 0.8 pounds per inch; a tensile strength of at least about 12 pounds per square inch; and an elongation (at break) of about 100%. In addition, the foam product used to form the resilient core member is a polyester that is die clickable.

In some example embodiments, the resilient core member may comprise a silicone foam material having a compression set (per ASTM D3574 (test D)) of less than about 15% and/or a density of greater than about 5 pounds per cubic foot (e.g., about 5.6 pounds per cubic foot, about 6 pounds per cubic foot, about 7 pounds per cubic foot, etc.).

In some example embodiments, the resilient core member may not include (and may be free of) any flame retardant (and may not have any added thereto at any time), for example, either during the process of making the resilient core member or in the final product of the resilient core member used in the example contacts. For example, the resilient core member may not be flame rated, the resilient core member may include less than about 1,000 parts per million of flame retardant, the resilient core member may include undetectable amounts of flame retardant, the resilient core member may include a de minimis or trivial amount of flame retardant; etc. In other example embodiments, the resilient core member may be entirely free of flame retardants.

In some example embodiments, the resilient core member (e.g., a foam material of the resilient core member, etc.) may not include (and may be free of, and may not have added thereto at any time) any ammonium compounds (e.g., ammonium carbonate, etc.), chlorine, bromine, antimony, compounds thereof, etc. either during the process of making the resilient core member or in the final product of the resilient core member used in the example contacts. And, such example embodiments of the contacts may be able to achieve flame ratings of V-0 under UL-94 (without having any flame retardant added to or present in the resilient core member at any time). This is a significant accomplishment given that presence of flame retardant inside a core member (and particularly inside a foam core member) can tend to decrease the core member's performance in compression set and compression load deflection tests.

In some example embodiments, the resilient core member may be provided (e.g., applied, coated, impregnated, mixed, plated, vapor deposited, fabricated, formed, combinations thereof, etc.) with flame retardants (e.g., halogen-free flame retardants, etc.). For example, various embodiments may include a resilient core member provided with halogen free flame retardant such that the resilient core member is able to achieve a flame rating under UL-94 of HF-1.

In some example embodiments, the resilient core member may have a density of at least about 3 pounds per cubic foot or more (e.g., about 3 pounds per cubic foot, about 3.1 pounds per cubic foot, about 3.5 pounds per cubic foot, about 4 pounds per cubic foot, about 5 pounds per cubic foot, about 5.6 pounds per cubic foot, etc.). For example, using a foam product for a resilient core member having a density of at least about 3.5 pounds per cubic foot provides a better compression set than a less dense foam material (e.g., a foam material having a density of about 3 pounds per cubic foot or less, etc.). But it is noted that in example embodiments where the resilient core member is made from urethane foam, flammability of the resilient core member may increase as the density of the resilient core member increases (e.g., a resilient core member having a density of about 4 pounds per cubic foot may be more flammable than a resilient core member having a density of about 3 pounds per cubic foot, etc.). Thus, it may become more difficult to achieve higher flame ratings (e.g., flame ratings of V-0 under UL-94, etc.) for contacts when using such a higher density urethane foam resilient core member (e.g., a urethane foam resilient core member having a density of about 4 pounds per cubic foot or more, etc.).

In some example embodiments, the electrically conductive layer may have a conductivity (or surface resistivity) of less than about 0.20 ohms per square after at least about 1,000 hours of exposure of the contacts made from the electrically conductive layer to a substantially constant temperature of at least about 40 degrees Celsius and a substantially constant relative humidity of at least about 90%. In other example embodiments, the electrically conductive layer may have a conductivity of less than about 0.07 ohms per square (e.g., about 0.04 ohms per square, about 0.03 ohms per square, etc.) under similar conditions.

In some example embodiments, the electrically conductive layer can provide fire resistance to the contacts.

In some example embodiments, the adhesive may include environmentally safe adhesives suitable for providing good bond strength between the electrically conductive layer and the resilient core member. The adhesive can be formed into a layer and then laminated in production of the contacts (e.g., fusion laminated to the electrically conductive layer, etc.).

In some example embodiments, the adhesive may include any of a wide range of flame retardants, including environmentally friendly flame retardants that are halogen free (e.g., free of halogens such as bromines, chlorines, etc.). Halogen-free flame retardants used in connection with the contacts and the adhesive thereof may include, for example, phosphorous-based flame retardants, etc. Particular examples of commercially available halogen-free phosphorous-based flame retardants are sold by Apex Chemical Company (Spartanburg, S.C.). Other example flame retardants that can be used include mineral oxides (e.g., magnesium hydroxide, antimony oxide, etc.), metal hydrates (e.g., aluminum trihydrate, etc.) boron compounds (e.g., boric acid, borax, etc.), melamines, silicones, etc.

In some example embodiments, the adhesive includes at least an effective amount of halogen-free flame retardant to achieve a predetermined flame rating. Alternatively, the adhesive can also include more than that effective amount. For example, the adhesive may include less than a predetermined percentage by dry weight of halogen-free flame retardant, below which percentage the adhesive provides at least a predetermined bond strength. It should be appreciated that there is a delicate balance that should be maintained with the halogen-free flame retardant and the adhesive. If the adhesive contains too much halogen-free flame retardant, the bond strength can be compromised. But if the adhesive does not include enough halogen-free flame retardant, then the contacts may not be able to meet the desired UL-94 flame rating (e.g., V-0, V-1, V-2, HB, HF-1, etc.). Accordingly, in one particular embodiment, an adhesive includes at least an effective amount of halogen-free flame retardant for providing a contact with a UL-94 flame rating of V-0, but less than a predetermined percentage below which the adhesive provides at least a sufficient bond strength for maintaining integrity of the contact (e.g., at least 4 ounces per inch width as determined by standard testing, for example, such as a 90 degree peel at 12 inches per minute, etc.). The various numerical ranges disclosed herein define acceptable balances between flame resistance (using halogen-free flame retardants) and adhesive bond strength to provide contacts that have an adhesive with adequate bond strength and adequate flame resistance (using halogen-free flame retardants), for example, to achieve flame ratings of V-0 under UL-94.

In some example embodiments, the adhesive (e.g., defining an adhesive layer, etc.) comprises a thermoplastic polyurethane resin. In some of these example embodiments, the adhesive may comprise about 25% to about 60% by dry weight (e.g., about 30% by dry weight, about 50% by dry weight, about 55% by dry weight, etc.) of the thermoplastic polyurethane resin (e.g., with flame retardant making up the rest of the adhesive, etc.). In some example embodiments, the adhesive may include an amount of halogen-free flame retardant of at least about 30% (+/− about 5%) but not more than about 70% by dry weight. Or, the adhesive may include an amount of halogen-free flame retardant of at least about 50% but not more than about 63% by dry weight. Or, the adhesive may include an amount of halogen-free flame retardant of at least about 54.5% to about 67.3% by dry weight. Or, the adhesive may include an amount of halogen-free flame retardant of about 63% by dry weight. Or, the adhesive may include an amount of halogen-free flame retardant of about 55% by dry weight. Or, the adhesive may include an amount of halogen-free flame retardant of about 50% by dry weight.

In some example embodiments, the adhesive may be loaded (e.g., fabricated, formed, mixed, etc.) with an effective amount of halogen-free flame retardant (e.g., more than about 30% by dry weight, about 30% to about 70%, about 40% to about 67% by dry weight, about 54.5% to about 63% by dry weight, about 45% to about 56% by dry weight, about 50% by dry weight, about 55% by dry weight, etc.), which may enable the contacts to achieve a predetermined flame retardant rating (e.g., a UL-94 flame rating of V-0, etc.). In some of these example embodiments, the contacts may include an adhesive loaded with an effective amount of halogen-free flame retardant in combination with halogen-free flame retardant provided to the resilient core member, thereby allowing the contacts to achieve a predetermined flame retardant rating (e.g., a UL-94 flame rating of V-0, etc.) while still being halogen free. In other ones of these example embodiments, the contacts may include an adhesive loaded with an effective amount of halogen-free flame retardant such that the contacts can achieve a predetermined flame retardant rating (e.g., a UL 94 flame rating of V-0, etc.) without flame retardant being provided to the resilient core member thereof.

In some example embodiments, the effective amount of halogen-free flame retardant in the adhesive is less than a predetermined percentage below which the loaded adhesive provides at least a predetermined bond strength (e.g., at least about 10 ounces per inch width as determined, for example, by a 90 degree peel (or T-peel) test at 12 inches per minute, etc.). Thus, it should be appreciated that if too little flame retardant is included in the adhesive, flame resistance will be insufficient. And, if too much flame retardant is included in the adhesive, bond strength will be insufficient. As described herein, a balance has been found between flame resistance and bond strength. In addition to the amount of flame retardant in the adhesive, the bond strength of the adhesive may also depend on the particular substrate to which it is bonding.

In some example embodiments, the adhesive may include a thermoplastic polyurethane composite resin composition loaded with halogen-free flame retardant instead of halogen-based flame retardant (such that the adhesive does not include halogenated flame retardants), instead of expandable carbon graphite (ECG) flame retardants, and/or instead of red phosphorous flame retardants (e.g., which can be detected using a microscope, etc.). For example, the adhesive may include halogen-free phosphorous-based flame retardants that do not include ECG or red phosphorus flame retardants. As such, in these example embodiments the adhesive may be viewed as being free of (and not including) halogen (and halogen-based flame retardants), ECG, and/or red phosphorus. Contacts including such an adhesive may advantageously be capable of achieving UL-94 flame ratings of V-0, and may be able to avoid undesirable effects often associated with red phosphorous flame retardants and/or with ECG flame retardants. Notably when used in adhesives in contacts, red phosphorus may cause corrosion in the contacts and ECG, which is an electrically conductive material, may cause undesirable electrical shorts inside electronic devices.

In some example embodiments, the adhesive (the adhesive layer defined thereby) may have a thicknesses (e.g., an average thickness, a generally uniform thickness, etc.) of less than about 1 millimeter (e.g., about 0.5 millimeters or less, etc.). In some of these example embodiments, the adhesive layer may have thicknesses of about 0.1 millimeters or less (e.g., about 0.09 millimeters, about 0.06 millimeters, etc.).

In some example embodiments, the adhesive may define a single layer of material. For example, in these example embodiments the adhesive may include halogen-free flame retardant mixed therein such that the adhesive and the halogen-free flame retardant together define a single layer of material. Contacts including the example adhesive may be able to achieve flame ratings of V-0 under UL-94 (e.g., without having any flame retardant added to or present in the resilient core member at any time, etc.). By providing the halogen-free flame retardant to the adhesive in such a manner (so that the adhesive and halogen-free flame retardant define a single layer of material), multiple different layers of material (e.g., a first layer of adhesive and a second, separate layer of flame retardant covering the adhesive, etc.) are not required, for example, to achieve a desired flame rating (e.g., a flame rating of V-0 under UL-94, etc.). As such, the adhesive and halogen-free flame retardant defining a single layer of material may provide cost savings when used to make the contacts, improved ease in making the contacts, etc. Previously in the art, such multiple different layers of material were used to achieve desired flame ratings in contacts while avoiding problems associated with losing adhesive strength when the flame retardant was mixed into the adhesive.

In some example embodiments, the adhesive may include a solvent-based adhesive. For example, the adhesive may include a thermoplastic polyurethane resin composition (having flame retardant particles mixed therein) made via a wet coating process, where the adhesive is coated onto release paper. Here, a solvent (e.g., toluene, ethyl acetate, water, etc.) may be used to keep the adhesive liquid for coating prior to drying. But after the adhesive dries in a thin film form (e.g., in a layer between a resilient core member and an electrically conductive layer, where the adhesive layer may have a thickness of about 1 millimeter or less (e.g., about 0.09 millimeters, about 0.06 millimeters, etc.), etc.), the solvent evaporates leaving behind the thermoplastic polyurethane resin composition with the flame retardant particles mixed in. The amount of solvent remaining in the adhesive that didn't evaporate is very small (e.g., less than about 0.1%, etc.). Using this solvent based wet coating process may lead to better/higher adhesive bond strengths and also may allow for production of very thin adhesive layers (e.g., layers having thicknesses of about 1 millimeter or less (e.g., about 0.09 millimeters, about 0.06 millimeters, etc.), etc.) with enough halogen-free free flame retardant therein to allow contacts to achieve UL-94 flame ratings of V-0, even when that contacts do not include flame retardant additives in the foam and/or do not include ECG flame retardants, halogenated flame retardants, or red phosphorous flame retardants. It is noted that while the solvent may include water (e.g., such that the adhesive may include a water-based adhesive, etc.), solvents such as toluene, ethyl acetate, etc. may allow for more efficient manufacturing of the contacts, as water tends to take longer to evaporate during manufacture than do other solvents such as toluene, ethyl acetate, etc.

In some example embodiments, the adhesive may be prepared using suitable devices capable, for example, of effectively dispersing the flame retardant particles within the adhesive at a temperature greater than a melting point of the adhesive to thereby prepare the mixture of the adhesive and the flame retardant particles.

In some example embodiments, the adhesive may include a thermoplastic polyurethane resin composition made via an extrusion process without solvent and requiring no release paper.

In some example embodiments, the adhesive may also include at least one or more additives such as antioxidants, stabilizers, lubricants, reinforcing agents, pigments, colorants, plasticizers, etc. The additives may be included in the adhesive layers in desired amounts (or ranges of amounts) so as to not reduce bond strength and/or flame resistance of the adhesive layers.

In some example embodiments, two or more different kinds of adhesives may be used to define an adhesive layer of a contact.

Any suitable flame retardants may be used in connection with contacts of the present disclosure. Example flame retardants may include phosphorous-based flame retardants (e.g., organic phosphorus compounds, phosphinates (e.g., Exolit OP, etc.), diphosphinates, polymers thereof, cyclic phosphonate ester blends, combinations thereof, etc.), nitrogen compounds, ammonium compounds, mineral oxides (e.g., magnesium hydroxide, etc.), metal hydrates (e.g., aluminum trihydrate, etc.), boron compounds (e.g., boric acid, borax, etc.), melamine derivatives (e.g., melamines, melamine cyanurate, melamine phosphate, melamine polyphosphate, melamine borate, etc.), neoprenes, silicones, combinations thereof, etc.

Phosphorus flame retardants may interrupt decomposition in a condensed phase and may increase char yield during combustion, while providing flame retardancy, for example, to the contacts. For example, when phosphorus flame retardants are added to the adhesive used in contacts, the adhesive may provide flame retardancy to the contacts (particularly in contacts where the adhesive comprises a resin with high oxygen content, such as thermoplastic polyurethane resin). Here, the char generally includes a layer of carbonized resin caused by combustion. The formation of char helps inhibit spreading of fire through the contacts.

Example embodiments of the contacts may include combinations of flame retardants, additives, other compounds, etc. Such combinations may provide improved flame retardancy (e.g., may provide an expandable char layer through a synergy effect of the different flame retardants to thereby inhibiting the spread of oxygen and heat, etc.).

In some example embodiments, the contacts may include an adhesive comprising phosphorous flame retardants in combination with melamine derivatives and nitrogen compounds. Here, use of the phosphorous flame retardants in combination with the nitrogen compounds can promote generation of phosphoric acid amide through combustion, which forms an expandable char layer with increased thickness (thereby inhibiting transfer of heat and oxygen required for combustion).

Example embodiments of the contacts may include adhesives comprising flame retardants (e.g., halogen-free flame retardants, etc.) having desired particle sizes. Particle sizes of flame retardants may influence physical properties of the adhesive layers. For example, flame retardants with smaller particle sizes may provide improved physical properties and flame retardancy to the adhesive layers (e.g., larger particle sizes may inhibit dispersion within the adhesive layers, etc.). In some of these example embodiments, the flame retardants having particle sizes between about 1 micrometer and about 60 micrometers (and more preferably between about 1 micrometer and about 20 micrometers).

Following are various example adhesives suitable for use with the contacts of the present disclosure. One example adhesive includes a three component mixture, comprising 998 HS (a solvent based polyurethane adhesive product (having about 53% solids) made by DSM NeoSol Inc. (East Providence, R.I.)), AP-422 (a flame retardant ammonium polyphosphate (APP) product (having about 100% solids) made by Clariant GmbH (Germany)), and toluene (a solvent used to disperse the AP-422 and lower viscosity of the mixture). The mixture of this example included about 75 grams (or about 53% by wet weight) of 998HS, about 36 grams (or about 26% by wet weight) of AP-422, and about 30 grams (or about 21% by wet weight) of toluene. As such, the mixture had a dry weight percentage of 998HS of about 52.5%, a dry weight percentage of AP-422 of about 47.5%, a viscosity of about 8,280 centipoise, and a weight pick-up of about 4.20 opsy.

Another example adhesive includes a three component mixture, comprising 138-293C (a urethane adhesive product (having about 38% solids) made by DSM NeoSol Inc.), AP-462 (a flame retardant ammonium polyphosphate (APP) product (having about 100% solids) made by Clariant GmbH made from AP-422 by micro-encapsulation with melamine resin), and toluene (a solvent used to disperse the AP-462 and lower viscosity of the mixture). The mixture of this example included about 89 grams (or about 52% by wet weight) of 138-293C, about 50 grams (or about 29% by wet weight) of AP-462, and about 33 grams (or about 19% by wet weight) of toluene. As such, the mixture had a dry weight percentage of 138-293C of about 40.3%, a dry weight percentage of AP-462 of about 59.6%, a viscosity of about 2,580 centipoise, and a weight pick-up of about 3.62 opsy.

Another example adhesive includes a four component mixture, comprising 138-293C (a urethane adhesive product (having about 38% solids) made by DSM NeoSol Inc.), AP-462 (a flame retardant ammonium polyphosphate (APP) product (having about 100% solids) made by Clariant GmbH made from AP-422 by micro-encapsulation with melamine resin), toluene (a solvent used to disperse the AP-462 and lower viscosity of the mixture), and PCMLE 828 (an epoxy resin product made by Polochema (Taipei, Taiwan) used to improve adhesion of 138-293C). The mixture of this example included about 89 grams (or about 50% by wet weight) of 138-293C, about 50 grams (or about 28% by wet weight) of AP-462, about 33 grams (or about 19% by wet weight) of toluene, and about 6 grams of PCMLE 828 (or about 3% by wet weight). As such, the mixture had a dry weight percentage of 138-293C of about 37.6%, a dry weight percentage of AP-462 of about 55.7%, a dry weight percentage of PCMLE 828 of about 6.7%, a viscosity of about 2,520 centipoise, and a weight pick-up of about 3.7 opsy.

Another example adhesive includes a three component mixture, comprising 138-293C (a urethane adhesive product (having about 38% solids) made by DSM NeoSol Inc.), AP-462 (a flame retardant ammonium polyphosphate (APP) product (having about 100% solids) made by Clariant GmbH made from AP-422 by micro-encapsulation with melamine resin), and toluene (a solvent used to disperse the AP-462 and lower viscosity of the mixture). The mixture of this example included about 85 grams (or about 49% by wet weight) of 138-293C, about 55 grams (or about 32% by wet weight) of AP-462, and about 33 grams (or about 19% by wet weight) of toluene. As such, the mixture had a dry weight percentage of 138-293C of about 37%, a dry weight percentage of AP-462 of about 63%, and a viscosity of about 2,070 centipoise.

Another example adhesive includes a four component mixture, comprising 144-122 (a solvent based urethane adhesive product (with a solids content of about 28%) made by DSM NeoSol Inc.), OP-935 (a fine-grained organic phosphinate flame retardant product (having about 100% solids) made by Clariant GmbH), FR CROS 489 (a special grade ammonium polyphosphate (APP) product (having about 100% solids) coated with melamine and made by Budenheim Iberica (Germany)), PCMLE 828 (an epoxy resin product made by Polochema (Taipei, Taiwan), ED 5121 (a colorant product made by Cardinal Color, Inc. (Paterson, N.J.)), and toluene (a solvent used to disperse the FR CROS 489 and lower viscosity of the mixture). The mixture of this example included about 88 grams (or about 52% by wet weight) of 144-122, about 28 grams (or about 16.7% by wet weight) of OP-935, about 3.5 grams (or about 2.1% by wet weight) of FR CROS 489, about 13 g (or about 7.7% by wet weight) of PCMLE 828, about 0.3 grams of ED 5121 (or about 0.5% by wet weight), and about 35 grams (or about 21% by wet weight) of toluene. As such, the mixture had a dry weight percentage of 144-122 of about 35.6%, a combined dry weight percentage of OP-935 and FR CROS 489 of about 45.6%, and a dry weight percentage of PCMLE 828 of about 18.8%. In addition, the mixture had a viscosity of about 1,500 centipoise and a weight pick-up of about 2.28 opsy.

Another example adhesive includes a four component mixture, comprising Dispercoll 8758 (a water based polyurethane adhesive product (having a solids content of about 40%) made by Bayer MaterialScience (Pittsburgh, Pa.)), AP-422 (a flame retardant ammonium polyphosphate (APP) product (having about 100% solids) made by Clariant GmbH), Rheolate-2000 (a rheology modifier made by Elementis Specialties Inc. (Highstown, N.J.)), and water (a solvent used to disperse the AP-422 and lower the viscosity of the mixture). The mixture of this example included about 208 grams (or about 54% by wet weight) of Dispercoll 8758, about 96 grams (or about 25% by wet weight) of AP-422, about 4 grams (or about 1% by wet weight) of Rheolate-2000, and about 80 grams (or about 20% by wet weight) of water. As such, the mixture had a dry weight percentage of Dispercoll 8758 of about 46.1%, a dry weight percentage of AP-422 of about 53.3%, and a dry weight percentage of Rheolate-2000 of about 0.6%. In addition, the mixture had a viscosity of about 13,740 centipoise and a weight pick-up of about 3.4 opsy.

In some example embodiments, contacts may have trapezoid cross-sectional shapes. In these embodiments, lower surfaces of the contacts may be generally flat for installation to printed circuit boards, and the trapezoidal shapes may reduce interference of the contacts with other items on the printed circuit boards.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more example embodiments of the present disclosure are provided for purpose of illustration only and do not limit the scope of the present disclosure, as example embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combination of ranges for the value that might be claimed using endpoints of the disclosed ranges.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items. The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A metallized film-over-foam contact for circuit grounding of surface mount technology devices, the contact comprising:
    a resilient core member;
    a solderable electrically conductive layer including a metallized film; and
    an adhesive bonding the solderable electrically conductive layer to the resilient core member, the adhesive having no more than a maximum of 900 parts per million chlorine, no more than a maximum of 900 parts per million bromine, and no more than a maximum of 1,500 parts per million total halogens;
    whereby the contact includes a plate positioned between the contact and a solder pad, wherein the plate and the solder pad are coupled with the contact via solder paste, whereby the plate operates to provide a rigid structure to the contact and separate the contact from the solder pad.

2. The contact of claim 1, wherein the contact has a flame rating of V-0 under Underwriter's Laboratories (UL) Standard No. 94.

3. The contact of claim 1, wherein the contact has a flame rating of V-1, V-2, or HB under Underwriter's Laboratories (UL) Standard No. 94.

4. The contact of claim 1, wherein the solderable electrically conductive layer includes a metallized polyimide film.

5. The contact of claim 1, wherein the contact has no more than a maximum of 900 parts per million chlorine, no more than a maximum of 900 parts per million bromine, and no more than a maximum of 1,500 parts per million total halogens.

6. The contact of claim 1, wherein the contact is able to withstand solder reflow conditions and temperatures and maintain operational structural integrity following a solder reflow operation.

7. A halogen-free metallized film-over-foam contact for circuit grounding of surface mount technology devices, the contact comprising:
    a resilient core member;
    a metal composition film surrounding at least part of the resilient core member and that is solderable; and
    an adhesive bonding the metal composition film to the resilient core member;
    wherein the resilient core member, the metal composition film, and the adhesive combined have no more than a maximum of 900 parts per million chlorine, no more than a maximum of 900 parts per million bromine, and no more than a maximum of 1,500 parts per million total halogens such that the contact is halogen free; and
    wherein the contact has a flame rating of V-0 under Underwriter's Laboratories (UL) Standard No. 94;
    whereby the contact includes a plate positioned between the contact and a solder pad, wherein the plate and the solder pad are coupled with the contact via solder paste, whereby the plate operates to provide a rigid structure to the contact and separate the contact from the solder pad.

8. The contact of claim 7, wherein the metal composition film includes a metallized polyimide film.

9. The contact of claim 7, wherein the contact is able to withstand solder reflow conditions and temperatures and maintain operational structural integrity following a solder reflow operation.

10. A method of installing a flame retardant, halogen free metallized film-over-foam contact to a surface of a printed circuit board, the contact including a resilient core and a metallized film surrounding at least part of the resilient core, the method comprising soldering the metallized film of the halogen free contact to a surface of a printed circuit board via a plate and a solder pad where the plate is positioned between the contact and the solder pad; and coupling the solder pad with the contact via solder paste whereby the plate is configured to provide a rigid structure to the contact and separate the contact from the solder pad, whereby an electrical pathway is established from the printed circuit board to the contact through the metallized film, wherein the contact has no more than a maximum of 900 parts per million chlorine, no more than a maximum of 900 parts per million bromine, and no more than a maximum of 1,500 parts per million total halogens.

11. The method of claim 10, further comprising placing the contact using a surface mount technology machine onto a ground trace of the printed circuit board, wherein the ground trace is pre-screened with the solder paste.

12. The method of claim 11, further comprising performing a solder reflow operation while the contact is on the solder paste to thereby solder the contact to the ground trace of the printed circuit board.

13. The method of claim 10, wherein the contact has a flame rating of V-0 under Underwriter's Laboratories (UL) Standard No. 94.

14. The method of claim 10, wherein the contact has a flame rating of V-1, V-2, or HB under Underwriter's Laboratories (UL) Standard No. 94.

15. The method of claim 10, wherein the contact is able to withstand solder reflow conditions and temperatures and maintain operational structural integrity following a solder reflow operation.

16. The contact of claim 1, wherein:
the resilient core member comprises silicone foam;
the solderable electrically conductive layer includes a metallized polyimide film;
the contact has no more than a maximum of 900 parts per million chlorine, no more than a maximum of 900 parts per million bromine, and no more than a maximum of 1,500 parts per million total halogens; and
the contact has a flame rating of V-0 under Underwriter's Laboratories (UL) Standard No. 94.

17. The contact of claim 16, wherein the contact is able to withstand solder reflow conditions and temperatures up to at least about 280 degrees Celsius and maintain operational structural integrity following a solder reflow operation.

18. The contact of claim 7, wherein:
the resilient core member comprises silicone foam;
the metal composition film includes a metallized polyimide film; and
the contact is able to withstand solder reflow conditions and temperatures up to at least about 280 degrees Celsius and maintain operational structural integrity following a solder reflow operation.

19. The contact of claim 18, wherein the silicone foam has a density of about 15 pounds per cubic foot or more.

20. The method of claim 10, wherein:
the resilient core comprises silicone foam;
the metallized film includes a metallized polyimide film; and
the contact has a flame rating of V-0 under Underwriter's Laboratories (UL) Standard No. 94.

* * * * *

UNITED STATES PATENT AND TRADEMARK OFFICE
CERTIFICATE OF CORRECTION

PATENT NO. : 9,131,616 B2  
APPLICATION NO. : 14/219104  
DATED : September 8, 2015  
INVENTOR(S) : Wang et al.

Page 1 of 1

It is certified that error appears in the above-identified patent and that said Letters Patent is hereby corrected as shown below:

Title Page, Item (72) Inventor is corrected to read:
-- Weifan Wang, New Taipei (TW);
 Yi-Shen Lin, New Taipei (TW);
 Larry D. Creasy, Jr., St. Clair (MO);
 Daisuke Yokochi, Aoba-ku, Yokohama (JP) --.

Signed and Sealed this
Twenty-sixth Day of January, 2016

Michelle K. Lee
*Director of the United States Patent and Trademark Office*